United States Patent [19]
Kouno et al.

[11] Patent Number: 5,539,406
[45] Date of Patent: Jul. 23, 1996

[54] SERIES-PARALLEL TYPE A-D CONVERTER FOR REALIZING HIGH SPEED OPERATION AND LOW POWER CONSUMPTION

[75] Inventors: Hiroyuki Kouno; Toshio Kumamoto; Takahiro Miki, all of Hyogo, Japan

[73] Assignee: Mitsubishi Denki Kabushiki Kaisha, Tokyo, Japan

[21] Appl. No.: 264,676

[22] Filed: Jun. 23, 1994

[30] Foreign Application Priority Data

Jul. 2, 1993 [JP] Japan ................................. 5-164862
Apr. 28, 1994 [JP] Japan ................................. 6-091335

[51] Int. Cl.$^6$ .................................................. H03M 1/12
[52] U.S. Cl. ........................................................ 341/155
[58] Field of Search .................................. 341/155, 156, 341/144, 118

[56] References Cited

U.S. PATENT DOCUMENTS 5,327,135  7/1994  Hosotani et al. ...................... 341/156

FOREIGN PATENT DOCUMENTS

| | | |
|---|---|---|
| 1-316025 | 12/1989 | Japan . |
| 2-121525 | 5/1990 | Japan . |
| 3-212025 | 9/1991 | Japan . |
| 4-43718 | 2/1992 | Japan . |
| 5-95286 | 4/1993 | Japan . |

OTHER PUBLICATIONS

"Analysis and Design of Analog Integrated Circuits", Second Edition, by Paul R. Gray and Robert G. Meyer, 1984.
"A 40 Msps 10–bit Video BiCMOS Analog to Digital Converter" Journal of Electronics, Information and Communication Engineers of Japan, C–II, vol. J7, 4–C–II, No. 2, pp. 81–91, Feb. 1991, by Yasuhiro Sugimoto et al.
"A 10–b 75–MSPS Subranging A/D Converter with Integrated Sample and Hold", IEEE Journal of Solid–State Circuits, vol. 25, No. 6, Dec., 1990, by Reinhard Petschacher et al.
"A 10–bit 20–MHz Two–Step Parallel A/D Converter with Internal S/H" IEEE Journal of Solid State Circuits, vol. 24, No. 1, Feb. 1989, by Toshihiko Shimizu et al.

*Primary Examiner*—Brian K. Young
*Attorney, Agent, or Firm*—Lowe, Price, LeBlanc & Becker

[57] ABSTRACT

An upper comparator group compares an analog signal with upper reference potentials applied from upper ladder resistance network. A switch group outputs the predetermined intermediate reference potential of the ladder resistance network to an analog subtracting circuit in response to the upper comparison results. The analog subtracting circuit subtracts the intermediate reference potential from the analog signal for producing an input signal for use in the lower side. A lower ladder resistance network outputs lower reference potentials obtained by dividing by resistors constant static intermediate reference potentials of the ladder resistance network applied from a differential amplifying circuit. A lower comparator group compares the lower reference potentials with the input signal for lower comparison. The upper and the lower comparison results are converted into a digital signal by upper and the lower encoders and the adding/subtracting circuit.

34 Claims, 23 Drawing Sheets

SERIES-PARALLEL TYPE A-D CONVERTER FOR REALIZING HIGH SPEED OPERATION AND LOW POWER CONSUMPTION

BACKGROUND OF THE INVENTION

1. Field of the Invention

The present invention relates to an analog to digital converter (hereinafter referred to as A-D converter) which converts an analog signal into a digital signal, and more particularly, to a series-parallel type A-D converter for realizing high speed operation and low power consumption.

2. Description of the Background Art

AD converters have come to be utilized in various kinds of apparatus as more and more signals come to be processed in digital manner, and thus, there exists the need for an A-D converter enabling high speed operation, high accuracy and low power consumption. As to A-D converters for video cassette recorders (VCRs), for example, an A-D converter having an accuracy in the order of ten bits is required, since high definition TVs, VCRs or the like have been developed. A serial-parallel type A-D converter realizing above-mentioned high speed operation and low power consumption is disclosed in *Journal of Electronics, Information and Communication Engineers of Japan*, C-II, Vol. J7, 4-C-II, No. 2, pp. 81–91, February 1991. A conventional A-D converter having the same structure as the above-described A-D converter will be described below referring to the drawings.

FIG. 8 shows a structure of a conventional A-D converter.

In FIG. 8, an A-D converter includes a sample and hold circuit 1, an upper comparator group 2, a clock generator 6, an upper encoder 7, a lower ladder resistance network 9, a lower comparator group 10, a lower encoder 11, an adding/subtracting circuit 13, an upper ladder resistance network 20, an analog switch group 21, and a buffer amplifier group 22.

Sample and hold circuit 1 is provided for sampling an instantaneous value of an applied analog signal, holding the same for a certain period of time, and outputting the same to upper comparator group 2 and buffer amplifier group 22.

Upper ladder resistance network 20 is formed by a plurality of resistors which are connected in series. Predetermined potentials VRT and VRB are respectively input to both ends of upper ladder resistance network 20. Upper ladder resistance network 20 divides the voltage between VRT and VRB by the resistors into predetermined values which are output to upper comparator group 2 as upper reference potentials. Upper ladder resistance network 20 generates and outputs intermediate reference potentials, which are intermediate potentials of upper reference potentials, to analog switch group 21.

Upper comparator group 2 is formed by a plurality of comparators, each of which compares an output signal of sample and hold circuit 1 with an upper reference potential in response to a clock signal output from clock generator 6. For example, each comparator outputs a signal of a "H" (high potential) level when the input signal is larger than the reference potential, while it outputs a signal of a "L" (ground potential) level when the input signal is smaller than the reference potential. The output signal is called a thermometer code. Upper comparator group 2 detects a border between the "H" level and the "L" level of the thermometer code. In other words, according to logical determination of the result of each comparison, only one comparator corresponding to the border of the thermometer code is rendered operative (hereinafter referred to as activation). All comparators included in upper comparator group 2 are connected to analog switch group 21. One comparator which is activated outputs a control signal such as the "H" level signal to analog switch group 21 for controlling analog switch group 21. Other comparators output, for example, the "L" level signals to analog switch group 21 as control signals. Those control signals are output to upper encoder 7 as upper comparison result signals.

Upper encoder 7 is connected to adding/subtracting circuit 13. Upper encoder 7 converts the applied upper comparison result signals into an upper digital data by a predetermined logical processing and outputs the data to adding/subtracting circuit 13.

Analog switch group 21 includes analog switches the number of which is three times the number of comparators included in upper comparator group 2, and is connected to buffer amplifier group 22. Analog switch group 21 turns on three analog switches connected to one comparator which has been activated in response to control signals output from upper comparator group 2. The three analog switches output to buffer amplifier group 22 two intermediate reference potentials which are directly above and below the upper reference potential applied to the activated comparator.

Buffer amplifier group 22 includes four buffer amplifiers and is connected to lower ladder resistance network 9 and to lower comparator group 10. The output signal from sample and hold circuit 1 is input to one buffer amplifier included in buffer amplifier group 22, and the output signal therefrom is provided to lower comparator group 10. Three intermediate reference potentials output from analog switch group 21 are applied to the other three buffer amplifiers and then output to lower ladder resistance network 9.

Lower ladder resistance network 9 is formed by a plurality of resistors which are connected in series. The highest potential and the lowest potential among intermediate reference potentials output from buffer amplifier group 22 are input to both ends of lower ladder resistance network 9, while the middle one of the intermediate reference potentials is input to an middle point. Lower ladder resistance network 9 divides the voltage among those intermediate reference potentials by a plurality of resistors for outputting a plurality of lower reference potentials to lower comparator group 10.

Lower comparator group 10 is formed by a plurality of comparators, each of which is connected to lower encoder 11. Lower comparator group 10 operates similarly to upper comparator group 2. In other words, it compares the output signal of sample and hold circuit 1 applied via the buffer amplifier with lower reference potentials output from lower ladder resistance network 9 in response to a predetermined clock signal (not shown), and then outputs lower comparison result signals to lower encoder 11.

Lower encoder 11 is connected to adding/subtracting circuit 13. Lower encoder 11 encodes the applied lower comparison result signals by a predetermined logical processing and outputs a lower digital data to adding/subtracting circuit 13.

Adding/subtracting circuit 13 carries out addition/subtraction of upper and lower digital data which are applied from upper encoder 7 and lower encoder 11, respectively, and outputs a digital signal corresponding to the applied analog signal.

Operation of the A-D converter having the above-described structure will be described. The applied analog signal is sampled and held in sample and hold circuit 1 and is output to upper comparator group 2. A plurality of upper reference potentials which are resistance-divided in upper ladder resistance network 20 are output to upper comparator group 2.

Upper comparator group 2 compares the output signal from sample and hold circuit 1 with upper reference potentials in response to the clock signal output from clock generator 6 and outputs upper comparison result signals to upper encoder 7. Upper encoder 7 encodes the upper comparison result signals by a predetermined logical processing and outputs an upper digital data to adding/subtracting circuit 13. The upper digital data of the applied analog signal is thus generated.

Upper comparator group 2 detects a boarder between the "H" level and the "L" level of a thermometer code according to the upper comparison results, and activates only one comparator which corresponds to the boarder. The activated comparator outputs to analog switch group 21 a control signal for turning on analog switches. Analog switch group 21 turns on three analog switches in response to the applied control signal, and outputs three intermediate reference potentials to buffer amplifier group 22. Buffer amplifier group 22 outputs the applied three intermediate reference potentials to lower ladder resistance network 9. Those three intermediate reference potentials serve as reference potentials for lower comparison. The voltage between the highest potential and the lowest potential among intermediate reference potentials is equivalent to 2LSBs (Least Significant 2 Bits) of the upper comparison, and the potential between the highest potential and the middle potential is equivalent to 1LSB thereof. The voltage equivalent to 2LSBs in the upper comparison is divided into two or more for lower comparison of the analog signal. In addition to the highest potential and the lowest potential, the middle potential is input to lower ladder resistance network 9 in order to reduce the influence of stray capacitance over the settling time.

Lower ladder resistance network 9 by provides plurality of lower reference potentials to lower comparison group 10 by resistive-division of input intermediate potentials. Lower comparison group 10 compares the output signal from sample and hold circuit 1, which is applied through the buffer amplifier, with lower reference potentials and outputs the lower comparison result signals to lower encoder 11. Lower encoder 11 encodes the applied lower comparison result signals by a predetermined logical processing and outputs a lower digital data to adding/subtracting circuit 13. The lower digital data of the applied analog signal is thus produced.

Adding/subtracting circuit 13 digitally corrects the applied upper and lower digital data by adding/subtracting and finally produces a digital signal corresponding to the applied analog signal for output. Accordingly, the applied analog signal is converted into the digital signal for output.

As a more specific example, a 10-bit series-parallel type A-D converter having a structure similar to the above-described conventional A-D converter will be described referring to the drawings. FIG. 9 shows the structure of a conventional 10-bit A-D converter. The A-D converter shown in FIG. 9 is a series-parallel A-D converter including the upper part corresponding to 5 bits and the lower part corresponding to 6 bits enabling conversion of 10 bits.

In FIG. 9, the A-D converter includes sample and hold circuit 1, upper comparator group 2, clock generator 6, upper encoder 7, lower ladder resistance network 9, lower comparator group 10, lower encoder 11, adding/subtracting circuit 13, upper ladder resistance network 20, analog switch group 21, and buffer amplifier group 22. Same numerals are given to portions corresponding to those in the A-D converter shown in FIG. 6 since connections and the like are the same, and thus the description thereof will not be repeated.

Upper ladder resistance network 20 includes resistors R0–R65. Upper comparator group 2 includes comparators CH0–CH31. The resistance value of resistors R0–R65 is set to r/2. Normally, $2^5+1=33$ resistors are used in order to carry out the upper comparison of 5 bits. However, those resistors are further divided into two so that 66 resistors in total are used in this case in order to output the intermediate potentials of the intermediate reference potentials to lower ladder resistance network 9 in addition to the highest and the lowest potentials of the intermediate reference potentials. The comparison of upper 5 bits can be carried out by the above-mentioned structure.

Analog switch group 21 includes analog switches S0–S95. Three analog switches are connected to each comparator included in the upper comparator group 2. Those three analog switches respectively output three intermediate reference potentials including the highest, the middle, and the lowest potentials corresponding to the activated comparator to lower ladder resistance network 9 via buffer amplifier group 22.

Lower ladder resistance network 9 includes resistors RL0–RL64. Lower comparator group 10 includes comparators CL0–CL63. The above-mentioned structure enables the comparison of lower 6 bits.

An operation of the A-D converter structured as above will be described in detail. Assume that comparator CH30 included in upper comparator group 2 is activated as a result of the upper comparison. The activated comparator CH30 outputs a control signal to analog switches S87, S91, and S94 for turning on the analog switches. In response to the applied control signal, analog switches S87, S91, and S94 are turned on. Accordingly, analog switch S94 outputs an intermediate reference potential VT to a buffer amplifier B2 in buffer amplifier group 22, analog switch S91 outputs an intermediate reference potential VM to a buffer amplifier B1, and analog switch S87 outputs an intermediate reference potential VB to a buffer amplifier B0. Buffer amplifiers B0–B2 output the applied intermediate reference potentials VB, VM, and VT respectively to lower ladder resistance network 9.

Lower ladder resistance network 9 divides the voltage between intermediate reference potentials VT and VB by resistors RL0–RL64 and outputs 64 lower reference potentials to lower comparator group 10. Comparators CL0–CL63 included in lower comparator group 10 respectively compares the output signal of sample and hold circuit 1 applied via buffer V3 with the lower reference potentials. Since comparator CH30 has been activated as a result of the upper comparison, the output signal of sample and hold circuit 1 is between upper reference potentials VH and VL. Accordingly, when intermediate reference potentials VT and VB are used as the lower reference potentials, the output signal from sample and hold circuit 1 inevitably exists therebetween. This enables lower comparison of the analog signal applied to sample and hold circuit 1. Lower comparator group 10 outputs lower comparison result signals to lower encoder 11. Lower encoder 11 encodes the applied 64 comparison result signals and outputs a lower digital data to adding/subtracting circuit 13. Adding/subtracting circuit 13 corrects the applied lower and upper digital data and outputs a 10-bit digital data.

Now, a conventional A-D converter using a differential amplifier will be described below. The power supply voltage of A-D converters tends to be reduced in response to the need for low power consumption of the commercially available electronic devices in which the A-D converter is used. Thus, A-D converters having an increased dynamic range and a high resistance against noises or the like in which complementary differential analog signals are input instead of a single analog signal have been developed. Such an A-D converter is disclosed, for example, in "A 10-bit 75-MSPS Subranging A-D Converter with Integrated Sample and Hold", IEEE JSSC, vol. 25, No. 6, Dec., 1990. The conventional A-D converter having the same structure as the above-described A-D converter will be described with reference to the drawings. FIG. 20 shows another structure of the conventional A-D converter.

Referring to FIG. 20, an A-D converter includes a sample and hold circuit 101, an upper A-D converting unit 102, a lower A-D converting unit 103, reference voltage controlling circuits 104, 107, a digital-to-analog converter (referred to as DAC hereinafter) 105, an analog subtracting circuit 106, and a differential amplifier 108. Upper A-D converting unit 102 includes an upper ladder resistance network 110, an upper comparator CU, a latch circuit LU, and an upper encoder 111. Lower A-D converting unit 103 includes a lower ladder resistance network 112, a lower comparator CL, and a lower encoder 113.

Sample and hold circuit 101 responds to a predetermined clock signal CK0 for sampling/holding a positive differential analog input signal AP and a negative differential analog input signal AN, respectively, and outputting those signals to upper ladder resistance network 110 and analog subtracting circuit 106. Differential reference voltages Vr are applied to reference voltage controlling circuit 104 and DAC 105. Reference voltage controlling circuit 104 is provided to set an input range of upper A-D converting unit 102 in response to differential reference voltages Vr. DAC 105 is provided to set an LSB step which is the minimum unit of the D-A conversion in response to differential reference voltages Vr. Reference voltage controlling circuit 107 is provided to set an input range of lower A-D converting unit 103 in response to differential reference voltages output from DAC 105.

Differential analog signals output from sample and hold circuit 101 are compared with a plurality of upper reference potentials by upper ladder resistance network 110 and a plurality of upper comparators CU, and upper comparison result signals are output to a plurality of latch circuits LU and DAC 105. The plurality of latch circuits LU are provided to latch the applied upper comparison result signals and output those signals to upper encoder 111 which outputs upper digital signals DU in response to the applied upper comparison result signals.

DAC 105 responds to the applied upper comparison result signals to output reference signals for subtraction to analog subtracting circuit 106. Analog subtracting circuit 106 subtracts those reference signals applied from DAC 105 from respective differential analog signals AP, AN applied from sample and hold circuit 101, and outputs differential analog signals for lower comparison to differential amplifier 108. Differential amplifier 108 amplifies those analog signals by a predetermined gain for output to lower ladder resistance network 112.

Lower ladder resistance network 112 and a plurality of lower comparators CL compare the applied differential analog signals for lower comparison with predetermined lower reference potentials and output comparison results to lower encoder 113. Lower encoder 113 outputs lower digital signals DL in response to those result signals.

By the above operation, differential analog signals AP, AN are converted into upper digital signals DU by upper A-D converting unit 102, and then, into lower digital signals DL by lower A-D converting unit 103.

Now, the subtracting operation conducted by the analog subtracting circuit shown in FIG. 20 will be described. FIG. 21(a) and 21(b) show subtraction results by the analog subtracting circuit shown in FIG. 20.

With reference to FIGS. 21(a) and 21(b), when triangular waves, for example, are input as positive and negative analog input signals AP, AN, DAC 105 responds to upper comparison result signals to output positive and negative D-A conversion result signals in a stepwise manner to analog subtracting circuit 106. In analog subtracting circuit 106, a positive D-A conversion result signal is subtracted from positive analog input signal AP, and similarly, a negative D-A conversion result signal is subtracted from negative analog signal AN. As a result, analog subtracting circuit 106 outputs triangular waves within a range corresponding to 1LSB as positive and negative subtraction result signals, respectively, to differential amplifier 108. More particularly, the positive subtraction result signal within the range of 1LSB is output into the positive domain, about the reference potential while the negative subtraction result signal within the range of 1LSB is output into the negative domain.

Next, the detailed description will be given about differential amplifier 108 which differentially amplifies the above-described positive and negative subtraction result signals. FIG. 22 is a circuit diagram showing a structure of the differential amplifier shown in FIG. 20.

With reference to FIG. 22, the differential amplifier includes resistances R101–R104, and transistors Q101, Q102. Resistance R101 is connected to power supply voltage $V_{cc}$ and transistor Q101. Transistor Q101 is connected to resistance R103. The positive subtraction result signal is input as an input voltage Vin1 to a base of transistor Q101. Resistance R103 is connected to a constant current source IS1 which is connected to the ground. Resistance R102 is connected to power supply voltage $V_{cc}$ and transistor Q102 which is connected to resistance R104. The negative subtraction result signal is input as a differential input voltage Vin2 to a base of transistor Q102. Resistance R104 is connected to constant current source IS1. An output voltage Vo1 is applied from a node between resistance R101 and transistor Q101. An output voltage Vo2 is applied from a node between resistance R102 and transistor Q102.

Input/output characteristics of the differential amplifier structured as above will be described. FIG. 23 is a graph showing a relationship between the differential input voltage and the collector current of the differential amplifier shown in FIG. 20. FIG. 24 is a graph showing a relationship between the differential input voltage and the output voltage of the differential amplifier shown in FIG. 20.

As shown in FIGS. 23 and 24, collector current Ic1, Ic2 and output voltage Vo1, Vo2 change exponentially, and a linear area in which the change is almost linear is limited to a region indicated by LR. The characteristic of the change in the exponential manner can be clearly seen in the region other than linear area LR, so that differential input voltage Vin1–Vin2 is not proportional to output voltage Vo1, Vo2, thus incurring an error during amplification.

The results of amplification of positive and negative subtraction result signals by the above-described differential amplifying circuit will be described below. FIGS. 25(a) and 25(b) are graphs showing input/output characteristics of the differential amplifier shown in FIG. 20.

With reference to FIG. 23, if the positive or negative subtraction result signal in the shape of triangular wave is input about the reference potential positive and negative output signals are supplied respectively into the positive and the negative domain. More particularly, the range (2LSB) of the positive and negative subtraction result signals serving as input signals is larger than the range of linear area LR of the differential amplifier. In the region other than linear area LR, thus, the output signal is not proportional to the input signal, so that a portion NLR is generated in which a highly accurate amplification cannot be conducted. In the input/ output voltage characteristics of the differential amplifier, linear area LR becomes larger if a load resistance on an emitter side is increased. On the contrary, a voltage gain is reduced by the increased input range. The input range thus should be made larger in order to obtain the same output, which contradicts an end of reducing the voltage. Therefore, in order to achieve the reduction of the voltage, the differential amplifier has been used within the above-described range, with sacrificing an accuracy during amplification to a certain extent.

In the conventional A-D converter structured as above, the intermediate reference potentials of upper ladder resistance network 20 are transmitted through analog switch group 21 and buffer amplifier group 22 to lower ladder resistance network 9. At this time, upper comparator group 2 carries out upper comparison in response to the clock signal output from clock generator 6. Intermediate reference potentials of upper ladder resistance network 20 change according to the potential level of the analog signal applied via sample and hold circuit 1. Thus, the lower reference potentials of lower ladder resistance network 9 changes at every clock period. Accordingly, ringing is generated, because the stray capacitance of lower ladder resistance network 9 is charged/discharged according to the change of the lower reference potentials. Since the ringing affects the settling time of the lower reference potentials, the operating frequency of the A-D converter cannot be increased.

If the operating frequency is to be increased without changing the above-described structure, restraint of the ringing is required. In order to restrain the ringing, a large amount of current sufficient to charge/discharge the stray capacitance of the lower ladder resistance network 9 in a short time and also to reach a stable point is required, which causes increase of the power consumption of the device.

Further, in the conventional A-D converter using the differential amplifier, the highly accurate amplification of the lower analog signals cannot be conducted, since the positive and negative subtraction result signals are input respectively into the positive and negative domains about the reference potential. Accordingly, the lower A-D converting operation should be carried out using the lower analog signals having errors. As a result, the lower output signals include errors, and the highly accurate A-D conversion cannot be carried out.

SUMMARY OF THE INVENTION

It is an object of the present invention to provide an A-D converter which can restrain ringing and realize high speed operation and low power consumption.

Another object of the present invention is to provide an A-D converter allowing highly accurate conversion.

Still another object of the present invention is to provide an A-D converter suitable for high integration.

An A-D converter according to the present invention includes: a first reference potential generating circuit for generating first reference potentials; a second reference potential generating circuit for generating second reference potentials equivalent to the first reference potentials; a first comparing circuit for comparing a potential of an analog signal with the first reference potentials for outputting first comparison result signals; a selecting circuit for selecting a predetermined third reference potential from the second reference potentials in response to the first comparison result signals; a subtracting circuit for subtracting the third reference potential from the analog signal; a third reference potential generating circuit for generating predetermined fifth reference potentials based on predetermined fourth reference potentials among the second reference potentials; a second comparing circuit for comparing the output signal from the subtracting circuit with the fifth reference potentials for outputting second comparison result signals; and a converting circuit for converting the first and the second comparison result signals into a digital signal.

In the A-D converter including the above elements, the selecting circuit selects the predetermined third reference potential from the second reference potentials in response to the first comparison result signals. The subtracting circuit subtracts the third reference potential from the analog signal. The third reference potential generating circuit generates the predetermined fifth reference potentials based on the predetermined fourth reference potentials among the second reference potentials. The second comparing circuit compares the analog signal having the third reference potential subtracted therefrom with the fifth reference potentials for outputting the second comparison result signals. The fifth reference potentials, which are produced from the predetermined fourth reference potentials among the second reference potentials, will be constant static reference potentials free from influence of the change of the analog signal. Thus, ringing is restrained in the third reference potential generating circuit.

Consequently, the operating speed of the device can be accelerated because ringing does not occur in the fifth reference potentials generated by the third reference potential generating circuit. In addition, power consumption does not increase because the ringing is restrained not by increasing the current value in the third reference potential generating circuit, which contributes to low power consumption of the device.

A-D converter according to another aspect of the present invention includes: a first reference potential generating circuit for generating first reference potentials; a first comparing circuit for comparing a potential of an analog signal with the first reference potentials for outputting first comparison result signals; a selecting circuit for selecting a predetermined second reference potential from the first reference potentials in response to the first comparison result signal; a subtracting circuit for subtracting the second reference potential from the analog signal; a second reference potential generating circuit for generating predetermined fourth reference potentials based on predetermined third reference potentials among the first reference potentials; a second comparing circuit for comparing a potential of an output signal from the subtracting circuit with the fourth reference potentials for outputting second comparison result signals; and a converting circuit for converting the first and the second comparison result signals into a digital signal.

In the A-D converter including the above elements, the first comparing circuit carries out the first comparing operation using the first reference potentials generated by the first reference potential generating circuit. The selecting circuit selects the predetermined second reference potential among the first reference potentials, and the second reference potential generating circuit generates the predetermined fourth reference potentials using the first reference potentials. Thus, by using only the first reference potentials, the second reference potentials can be selected and the fourth reference potentials can be generated, so that other reference potential generating circuits will not be necessary.

In other words, the predetermined second reference potential is selected and the predetermined fourth reference potentials are generated by using only the first reference potential generating circuit. This simplifies the circuit structure, enabling high integration of the device.

An A-D converter according to still another aspect of the present invention includes an upper comparison circuit which compares a potential of an analog signal with a plurality of upper reference potentials; a subtracting circuit which, in response to upper comparison results by the upper comparison circuit, subtracts a predetermined voltage from the analog signal such that the potential of the analog signal is between a first and a second potential, and outputs a lower analog signal; a differential amplifier which amplifies differentially the lower analog signal; a lower comparison circuit which compares the potential of the lower analog signal amplified differentially by the differential amplifier with a plurality of predetermined lower reference potentials; and an output circuit which responds to the upper and lower comparison results by the upper and lower comparison circuits, respectively, to output digital signals corresponding to the above analog signal, the first and second potentials being included within the linear area of input/output characteristics of the differential amplifier.

Therefore, the lower analog signal is amplified only within the linear area of the differential amplifier for achieving a highly accurate amplification operation. As a result, the lower comparison operation is carried out using the lower analog signal which has been amplified highly accurately, thus implementing a highly accurate A-D converting operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
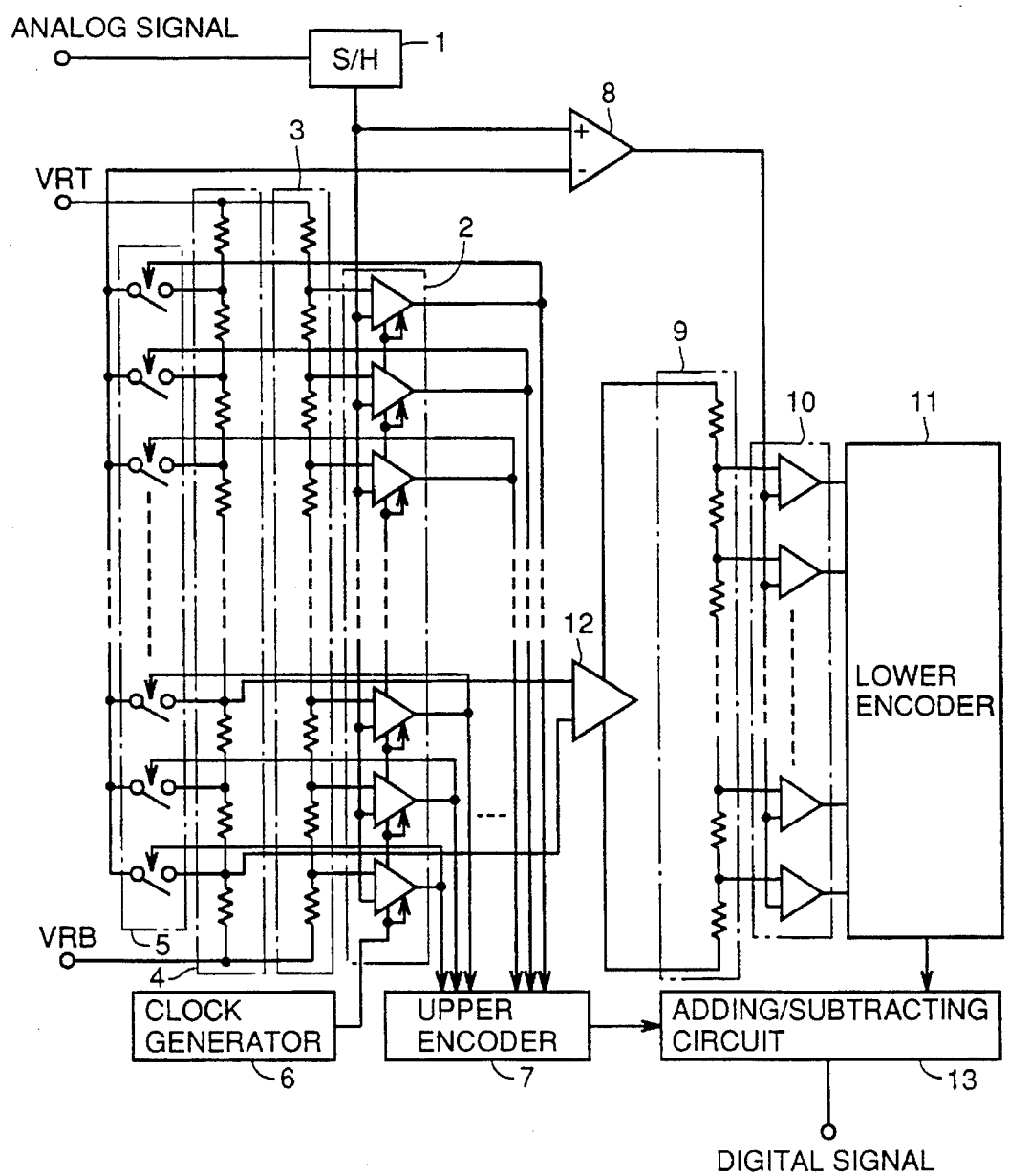
FIGS. 1-4 show structures of an A-D converter according to the first to fourth embodiments of the present invention.

An A-D converter according to the first embodiment of the present invention will be described referring to the drawings. FIG. 1 shows a structure of an A-D converter according to the first embodiment of the present invention.

Figure 8:
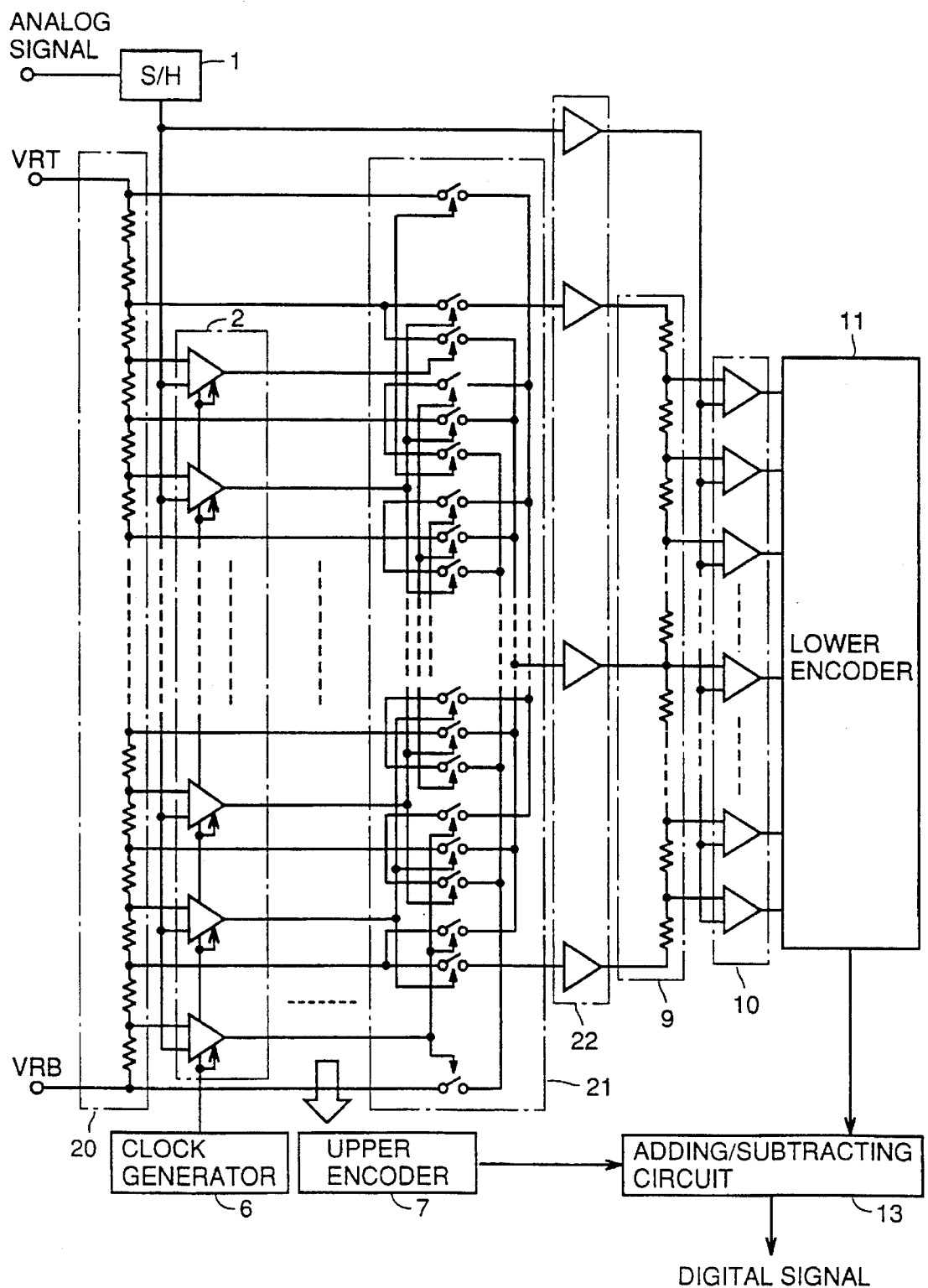
FIG. 8 shows a structure of a conventional A-D converter.
Figure 9:
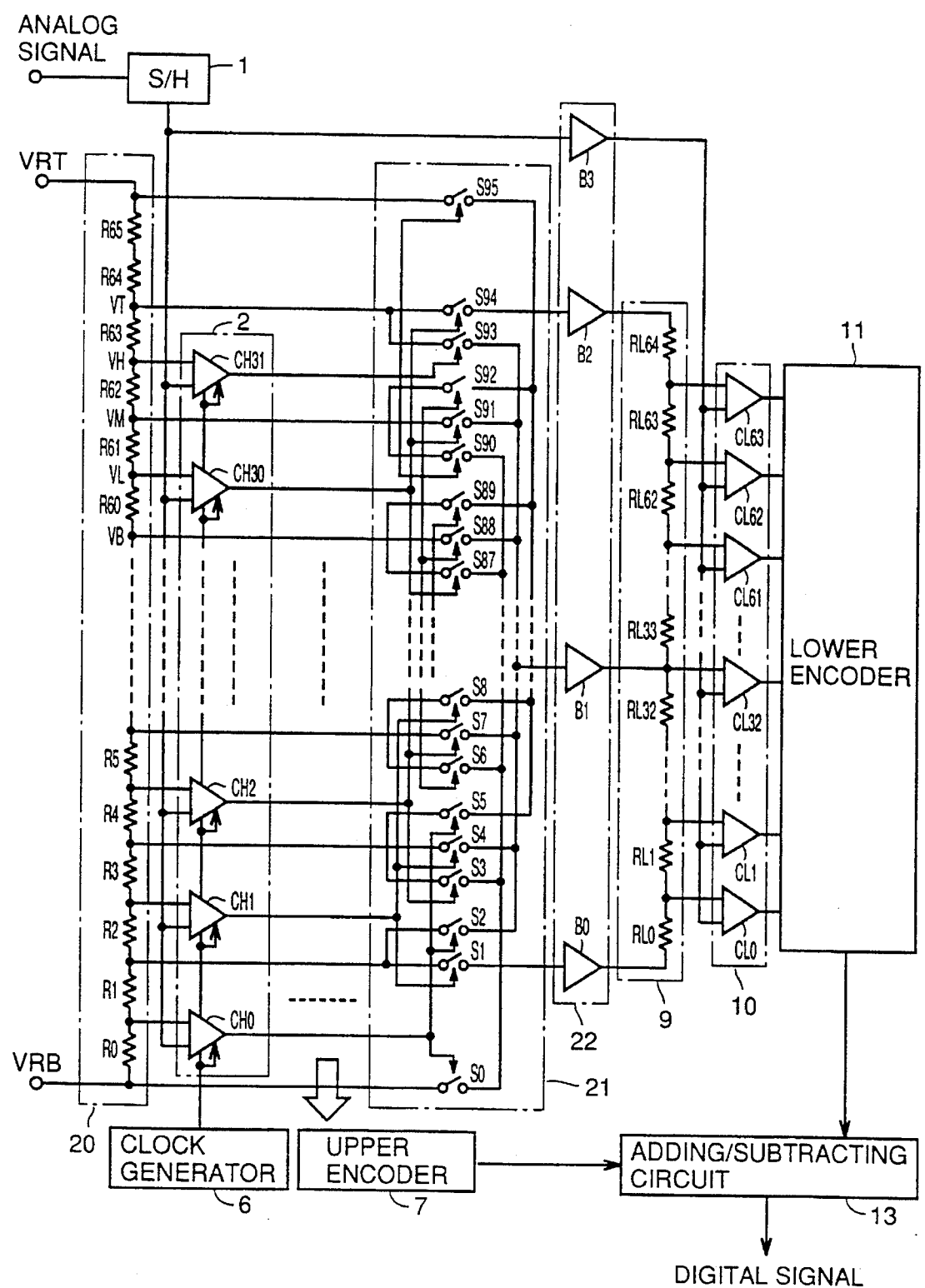
FIG. 9 shows a structure of a conventional A-D converter having a 10-bit structure.

In FIG. 1, the A-D converter includes a sample and hold circuit 1, an upper comparator group 2, an upper ladder resistance network 3, a ladder resistance network 4, a switch group 5, a clock generator 6, an upper encoder 7, an analog subtracting circuit 8, a lower ladder resistance network 9, a lower comparator group 10, a lower encoder 11, a differential amplifying circuit 12, and an adding/subtracting circuit 13. In FIG. 1, same numerals are given to portions having the same structure as the A-D converter shown in FIG. 8 and description thereof will not be repeated.

Upper ladder resistance network 3 includes a plurality of resistors which are connected in series. A resistance value of the resistors on both ends of upper ladder resistance network 3 is r/2 (r is a predetermined value) and a resistance value of the other resistors is r. Predetermined potentials VRT and VRB are applied to both ends of upper ladder resistance network 3 and a plurality of upper reference potentials are generated by dividing the voltage between potentials VRT and VRB by resistors. Each of the upper reference potentials is input to each comparator included in upper comparator group 2.

Ladder resistance network 4 includes a plurality of resistors which are connected in series. A resistance value of the resistors on both ends of ladder resistance network 4 is r/2 and a resistance value of the other resistors is r. The predetermined potentials VRT and VRB are applied to both ends of ladder resistance network 4 as in upper ladder resistance network 3. Ladder resistance network 4 divides the voltage between VRT and VRB by resistors and generates intermediate reference potentials identical to the upper reference potentials generated by upper ladder resistance network 3, and outputs those potentials to switch group 5.

Switch group 5 includes a plurality of switch elements. Each of intermediate reference potentials generated from ladder resistance network 4 is applied to one end of each switch element, while the other end thereof is connected to analog subtracting circuit 8. Each switch element responds to the upper comparison result signal output from upper comparator group 2, so that only one switch is turned on, leaving the other switches turned off.

Analog subtracting circuit 8 is connected to sample and hold circuit 1, switch group 5 and lower comparator group 10. An output signal from sample and hold circuit 1 is applied to a plus terminal of analog subtracting circuit 8, while an output signal from switch group 5 is applied to a minus terminal thereof. Analog subtracting circuit 8 subtracts the potential of the output signal of switch group 5 from the output signal of sample and hold circuit 1 and outputs an input signal for lower comparison to lower comparator group 10.

Differential amplifying circuit 12 is connected to ladder resistance network 4 and lower ladder resistance network 9. Predetermined intermediate reference potentials are applied from ladder resistance network 4 to differential amplifying circuit 12. For example, voltage corresponding to 2LSBs of the upper comparison are applied. Differential amplifying circuit 12 outputs the applied reference potentials to lower ladder resistance network 9.

Operation of the A-D converter structured as above will be described below. The applied analog signal is sampled and held in sample and hold circuit 1. The analog signal is input to upper comparator group 2 so as to be compared with the plurality of upper reference potentials which are generated by division by upper ladder resistance network 3. Upper comparator group 2 logically determines each comparison result, activates only one comparator, and outputs the upper comparison result signals to upper encoder 7. Upper encoder 7 digitally encodes the applied upper comparison result signals and outputs the upper digital data to adding/subtracting circuit 13. The operation so far is the same as the conventional A-D converter.

Upper comparator group 2 outputs the upper comparison result signals to switch group 5 as control signals for controlling the operation of respective switch elements included in switch group 5. These control signals serve to turn on a specific switch element in switch group 5 receiving the same intermediate reference potential as the upper reference potential of upper ladder resistance network 3 applied to the activated comparator, and at the same time to turn off the other switch elements. Accordingly, the intermediate reference potential identical to the upper reference potential provided to the activated comparator is output to analog subtracting circuit 8. Analog subtracting circuit 8 subtracts the intermediate reference potential applied by switch group 5 from the output signal of sample and hold circuit 1. In other words, a predetermined offset potential based on the upper comparison result is subtracted from the output signal of sample and hold circuit 1 for producing an input signal for lower comparison within a predetermined range. The predetermined range means, for example, a voltage of 1LSB of the upper comparison. The input signal for lower comparison produced in analog subtracting circuit 8 is output to lower comparator group 10.

On the other hand, the intermediate reference potentials of 2LSBs is input to differential amplifying circuit 12 from ladder resistance network 4. The intermediate reference potentials are generated by dividing a constant voltage between VRT and VRB by resistors and are always constant potentials irrelevant to time. In other words, the intermediate reference potentials input to differential amplifying circuit 12 are always in a static condition. Having received the constant intermediate reference potentials, differential amplifying circuit 12 always applies constant potentials to both ends of lower ladder resistance network 9. Thus, the potentials applied to lower ladder resistance network 9 do not change with time and stay constant so as not to charge/discharge the stray capacitance of lower ladder resistance network 9, thus preventing occurrence of the ringing. Consequently, lower ladder resistance network 9 can generate the lower reference potentials without ringing and output the potentials to lower comparator group 10.

In this embodiment, the intermediate reference potentials are generated by ladder resistance network 4 for producing the input signal for lower comparison and the lower reference potentials because of the following reason. Comparators included in upper comparator group 2 connected to upper ladder resistance network 3 are usually formed by bipolar transistors. The upper reference potential is applied to a base terminal of the bipolar transistor so that a very small current is generated. At this time, the current flowing through upper ladder resistance network 3 slightly changes, impairing the linearity thereof. On the other hand, ladder resistance network 4 is not connected to upper comparator group 2 so that the linearity thereof is not impaired, allowing generation of highly accurate intermediate reference potentials. Consequently, the highly accurate input signal for lower comparison and lower reference potentials can be generated, thus providing a highly accurate device.

Lower ladder resistance network 9 divides the output voltage from differential amplifying circuit 12 by resistors and outputs a plurality of lower reference potentials to lower comparator group 10. Lower comparator group 10 compares the input signal for lower comparison applied from analog subtracting circuit 8 with the lower reference potentials, and outputs the lower comparison result signals to lower encoder 11. Lower encoder 11 encodes the lower comparison result signals and outputs the lower digital data to adding/subtracting circuit 13. Adding/subtracting circuit 13 carries out adding/subtracting of the applied upper and lower digital data for correcting the data digitally, and outputs a digital signal corresponding to the applied analog signal.

Figure 2:
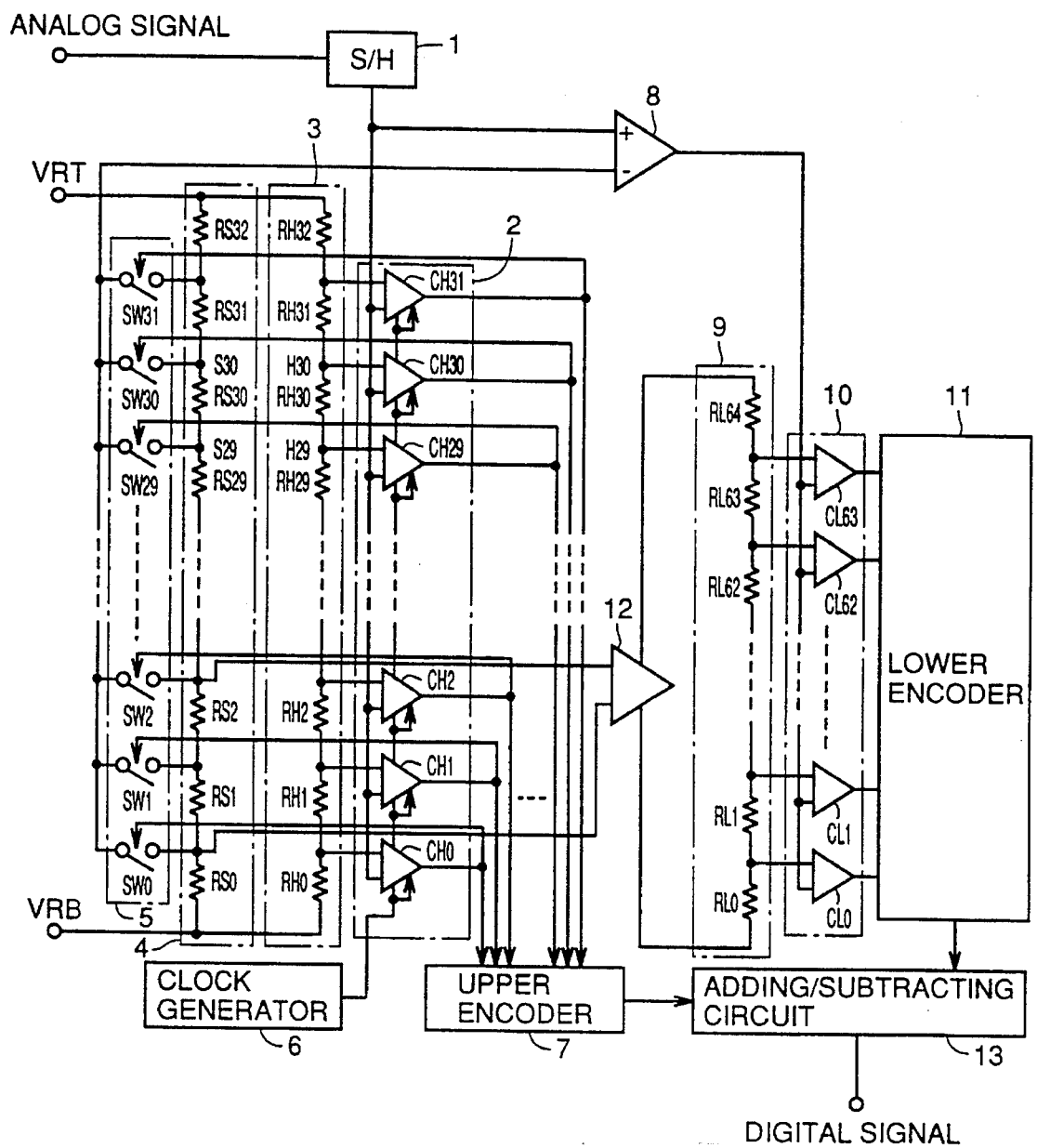

In order to facilitate understanding of the A-D converter of the first embodiment in greater detail, a 10-bit A-D converter will now be described as a second embodiment. FIG. 2 shows a structure of a 10-bit A-D converter according to the second embodiment of the present invention. The A-D converter shown in FIG. 2 is a series-parallel type A-D converter including the upper part corresponding to 5 bits and the lower part corresponding to 6 bits enabling conversion of 10 bits.

Since the A-D converter shown in FIG. 2 is similar to the A-D converter shown in FIG. 1 in structure, the same numerals are given to the same portions and the description thereof will not be repeated.

Upper ladder resistance network 3 includes resistors RH0–RH32. Resistors RH0–RH32 are connected in series, and a resistance value of resistors RH0 and RH32 is r/2, while a resistance value of the other resistors RH1–RH31 is r. Potentials VRT and VRB are respectively applied to both ends of upper ladder resistance network 3. Resistors RH0–RH32 divide the voltage between potentials VRT and VRB and output to upper comparator group 2 32 upper reference potentials obtained by equally dividing the voltage between VRT and VRB.

Upper comparator group 2 includes 32 comparators CH0–CH31. Comparators CH0–CH31 compare 32 upper reference potentials output from upper ladder resistance network 3 with the potential of the input signal for upper comparison applied from sample and hold circuit 1, and output 32 upper comparison result signals to upper encoder 7 and switch group 5.

Ladder resistance network 4 includes resistors RS0–RS32. Resistors RS0–RS32 are connected in series, and a resistance value of resistors RS0–RS32 is r/2, while a resistance value of the other resistors RS1–RS31 is r. Potentials VRT and VRB are also applied respectively to both ends of ladder resistance network 4 and 33 resistors RS0–RS32 effect division thereof and output 32 intermediate reference potentials to switch group 5. Since ladder resistance network 4 is the same in structure as ladder resistance network 3, 32 intermediate reference potentials are identical to 32 upper reference potentials.

Switch group 5 includes switch elements SW0–SW31. One end of each of the switch elements SW0–SW31 is connected to ladder resistance network 4, while the other end thereof is connected to a minus terminal of analog subtracting circuit 8. Operations of switch elements SW0–SW31 are controlled in response to 32 upper comparison result signals output from upper comparator group 2.

Lower ladder resistance network 9 includes resistors RL0–RL64. 65 resistors RL0–RL64 are connected in series, and a resistance value of resistors RL0 and RL64 is nr/2 (nr is a predetermined value), while a resistance value of the other resistors RL1–RL63 is nr. Potentials output from differential amplifying circuit 12 are applied to both ends of lower ladder resistance network 9, and 64 lower reference potentials obtained by division by 65 resistors RL0–RL64 are output to lower comparator group 10.

Lower comparator group 10 includes comparators CL0–CL63. 64 comparators CL0–CL63 compare the input signal for lower comparison output from analog subtracting circuit 8 with 64 lower reference potentials, and output 64 lower comparison result signals to lower encoder 11.

Operation of the A-D converter of the second embodiment structured as above will now be described. As to the upper comparing operation of an analog signal, the analog signal input to sample and hold circuit 1 is sampled and held, and then is output as an input signal for upper comparison. The input signal for upper comparison is compared with 32 equally divided upper reference potentials output from upper ladder resistance network 3 by 32 comparators CH0–CH31 included in upper comparator group 2. Upper comparator group output 32 upper comparison result signals as the comparison result to upper encoder 7. Upper encoder 7 encodes the applied 32 upper comparison result signals for outputting the upper digital data to adding/subtracting circuit 13. Thus, the comparing operation of upper 5 bits can be carried out.

Assume that comparator CH29 is activated as a result of the upper comparison. Comparator CH29 outputs the upper comparison result signal for turning on switch element SW29, and accordingly switch element SW29 is turned on. As a result, the intermediate reference potential at a node S29 equivalent to the upper reference potential at a node H29 applied to comparator CH29 is provided to a minus terminal of analog subtracting circuit 8 via switch element SW29. Analog subtracting circuit 8 subtracts the intermediate reference potential of node S29 from the input signal for upper comparison provided from sample and hold circuit 1. Since the input signal for upper comparison is between the upper reference potentials of nodes H30 and H29 (a potential of 1LSB), an input signal for lower comparison included within the range of 1LSB can be produced by subtracting from the input signal the intermediate reference potential of node S29 equivalent to the upper reference potential of node H29.

Operation of lower comparison will be described below. A voltage of 2LSBs of the upper comparison is applied from ladder resistance network 4 to differential amplifying circuit 12. Differential amplifying circuit 12 outputs the voltage of 2LSBs to both ends of lower ladder resistance network 9 such that the potential of 1LSB of analog subtracting circuit 8 can be included therebetween. In order to improve the accuracy of the lower comparison, the output signal may be amplified by a predetermined gain by differential amplifying circuit 12 and analog subtracting circuit 8.

Both the intermediate reference potentials output from ladder resistance network 4 and the potential output from differential amplifying circuit 12 are constant potentials. Thus, the potentials of lower ladder resistance network 9 become constant, and do not charge/discharge the stray capacitance of lower ladder resistance network 9, thus preventing the ringing. Consequently, lower ladder resistance network 9 can divide the voltage of 2LSBs by 65 resistors RL0–RL64 and output 64 lower reference potentials, which are equally divided without ringing, to lower comparator group 10. Lower comparator group 10 compares the input signal for lower comparison provided from analog subtracting circuit 8 with the 64 lower reference potentials, and outputs the comparison results to lower encoder 11 as 64 lower comparison result signals. Lower encoder 11 encodes the applied 64 lower comparison result signals for outputting the lower digital data to adding/subtracting circuit 13. Thus, the lower comparing operation of 6 bits can be carried out. The lower comparing operation may be carried out by comparing respective potential differences with the outputs from analog subtracting circuit 8 and lower ladder resistance network 9 used as differential outputs, and the inputs to comparators CL0–CL63 of lower comparator group 10 used as differential inputs.

Adding/subtracting circuit 13 carries out adding/subtracting of the applied upper and lower digital data for outputting a digital signal corresponding to the applied analog signal. Thus, the analog signal can be converted into the digital signal of 10 bits.

In this embodiment, as described above, the lower comparing operation is carried out by the lower reference potentials without ringing, so that the settling time of the lower reference potentials can be reduced and the operating frequency of the device can be increased. Further, it is not necessary to increase the current value because ringing is restrained by supplying static lower reference potentials which do not change with time, and therefore low power consumption of the device can be accomplished.

Figure 3:
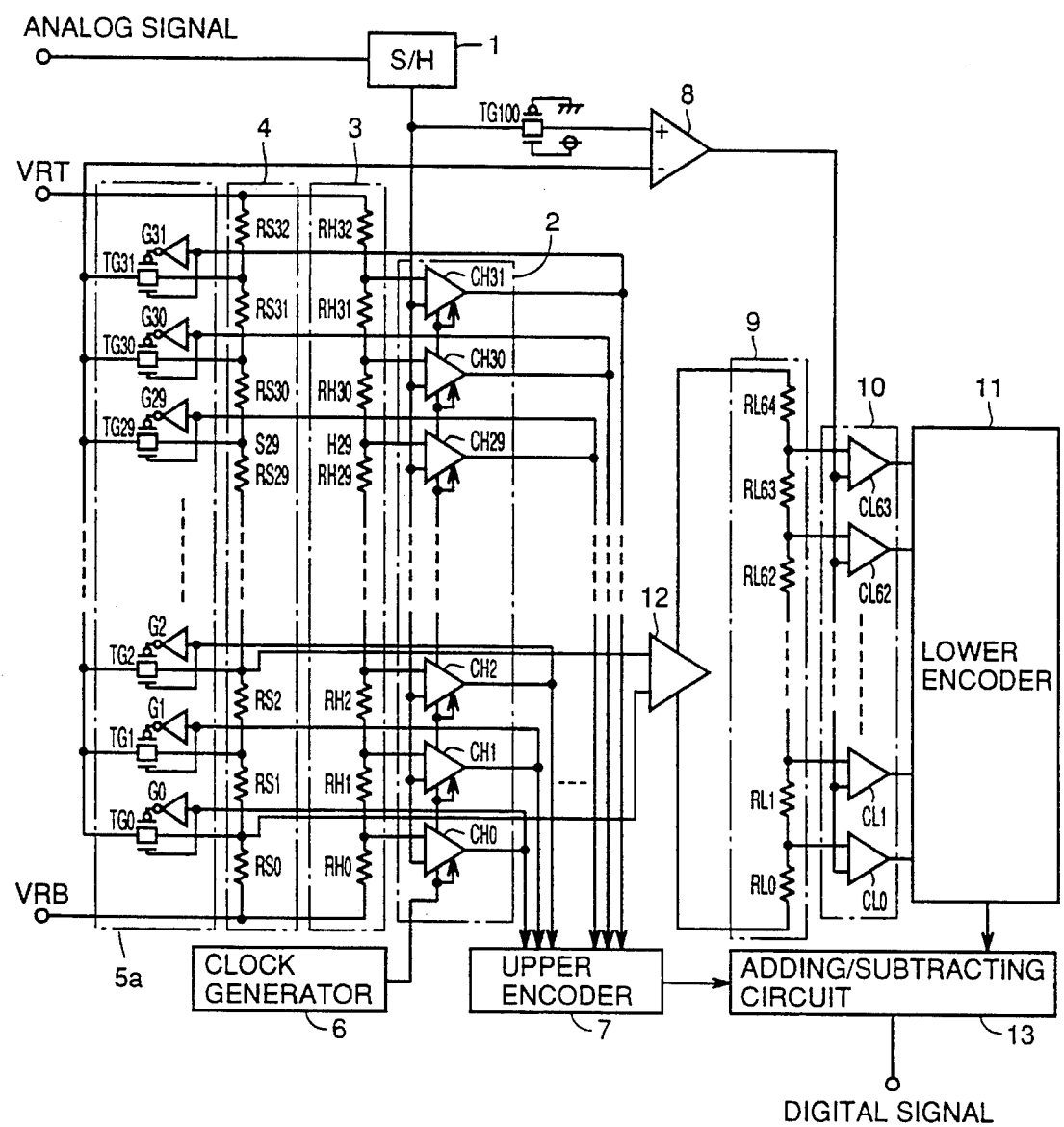

An A-D converter according to the third embodiment of the present invention will be described referring to the drawings. FIG. 3 shows the structure of the A-D converter according to the third embodiment of the present invention.

The A-D converter shown in FIG. 3 is similar to that shown in FIG. 2 except that a transmission gate TG100 is inserted between a plus terminal of analog subtracting circuit 8 and sample and hold circuit 1, and that a switch group 5a includes transmission gates TG0–TG31 and inverter circuits G0–G30.

Transmission gate TG100 has its gate electrode on the PMOS side connected to the ground potential and its gate electrode on the NMOS side connected to a high potential such as the supply potential. Thus, transmission gate TG100 is always turned on and an output signal from sample and hold circuit 1 is always input to the plus terminal of analog subtracting circuit 8.

Switch group 5a includes transmission gates TG0–TG31 and inverter circuits G0–G31. The input side of inverter circuit G0 is connected to the output side of comparator CH0 included in upper comparator group 2, and receives the upper comparison result signal. The output side of inverter circuit G0 is connected to the gate electrode on the PMOS side of transmission gate TG0. The gate electrode on the NMOS side of transmission gate TG0 is connected to the output side of comparator CH0, and receives the upper comparison result signal. Transmission gates TG1–TG31 and inverter circuits G1–G31 have similar structure.

Operation of switch group 5a and transmission gate TG100 will be described. Assume that comparator CH29 included in upper comparator group 2 is activated by the upper comparing operation. The activated comparator CH29 outputs, for example, the upper comparison result signal of the "H" level. The upper comparison result signal applied from comparator CH29 is converted into the "L" level signal by inverter circuit G29 and is input to the gate electrode on the PMOS side of transmission gate TG29. Also, the upper comparison result signal output from comparator CH29, which is at "H", is input to the gate electrode on the NMOS side of transmission gate TG29. Accordingly, transmission gate TG29 is turned on and it outputs the intermediate reference potential of node S29 to the minus terminal of analog subtracting circuit 8. On the other hand, the output signal of sample and hold circuit 1 is input via transmission gate TG100, which is normally turned on, to the plus terminal of analog subtracting circuit 8. Consequently, the signals are input to analog subtracting circuit 8 via transmission gates TG100 and TG29 which have the same properties such as voltage drop and temperature characteristics. Thus, the influence of voltage drop and temperature characteristics and the like caused by transmission gates TG100 and TG29 can be offset in analog subtracting circuit 8, allowing production of the input signal for lower comparison having a higher accuracy.

Figure 4:
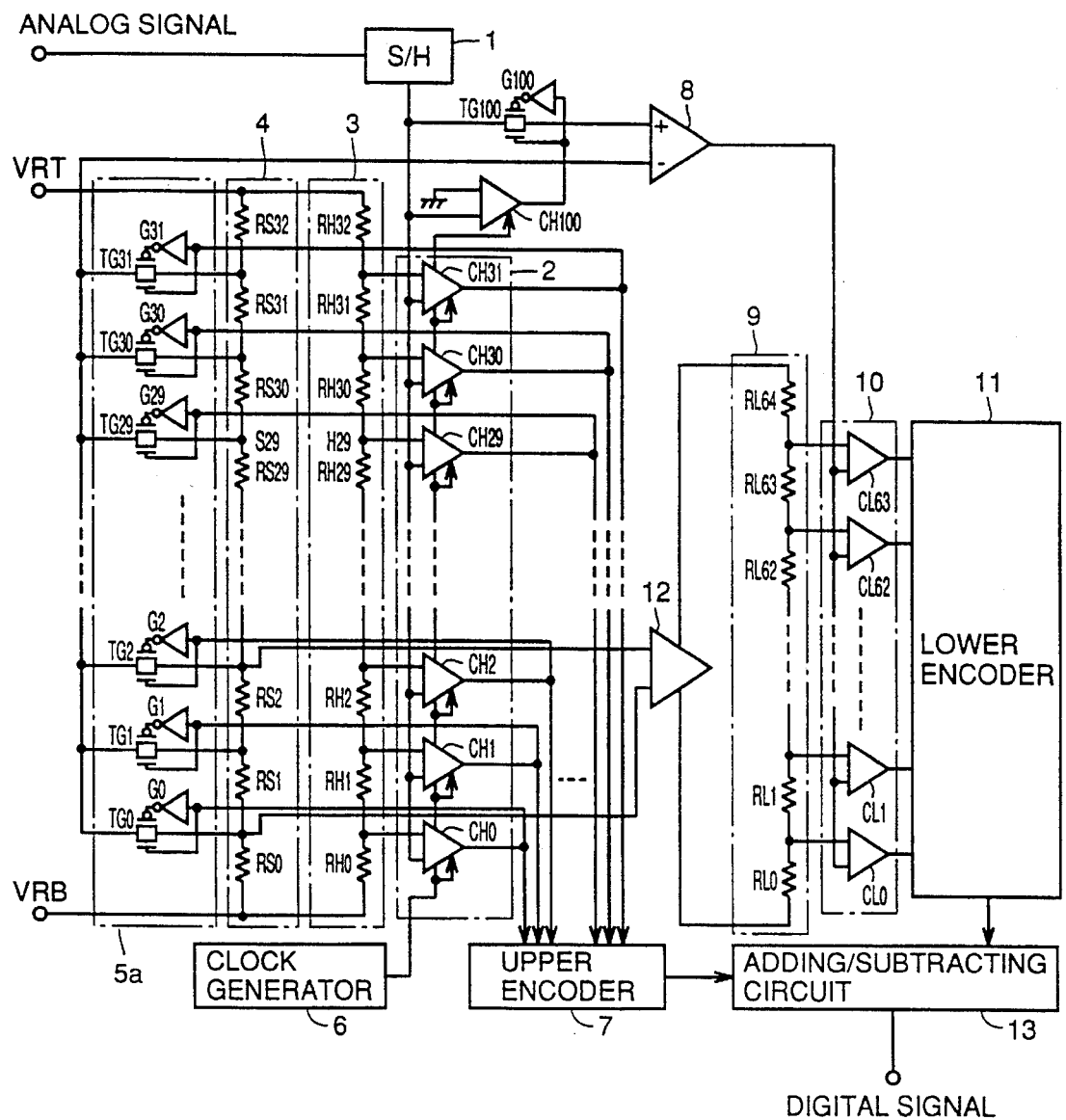

An A-D converter according to the fourth embodiment of the present invention will now be described referring to the drawings. FIG. 4 shows the structure of the A-D converter according to the fourth embodiment of the present invention.

The A-D converter shown in FIG. 4 is similar to that shown in FIG. 3 except that a comparator CH100 and an inverter G100 are provided and that transmission gate TG100 operates at the same timing as transmission gates TG0–TG31 included in switch group 5a.

Comparator CH100 has the same structure as comparators CH0–CH31 included in upper comparator group 2. The input side of comparator CH100 is connected to sample and hold circuit 1 and the ground potential. The output side of comparator CH100 is connected to the gate electrode of the NMOS side of transmission gate TG100 and the input side of inverter circuit G100. Comparator CH100 receives a clock signal output from clock generator 6 for carrying out comparing operation in response to the clock signal similarly to comparators CH0–CH31. The output side of inverter circuit G100 is connected to the gate electrode of the PMOS side of transmission gate TG100.

Operations of comparator CH100, transmission gate TG100 and inverter circuit G100 will now be described.

Comparator CH100 receives the output signal from sample and hold circuit 1 at one input terminal and the input signal for keeping comparator CH100 activated, i.e. the ground potential at the other input terminal. Thus, comparator CH100 is normally activated. Comparator CH100 operates in response to the operation of comparators CH0–CH31 for outputting, for example, the output signal of the "H" state to inverter circuit G100 and the gate electrode on the NMOS side of the transmission gate. Comparator CH100 has the output signal thereof invertered in inverter circuit G100 so as to apply a signal of the "L" state to the gate electrode on the PMOS side of transmission gate TG100. Accordingly, transmission gate TG100 is turned on and the output signal from sample and hold circuit 1 is applied to the plus terminal of analog subtracting circuit 8. At this time, one comparator among comparators CH0–CH31 is activated. For example, if comparator CH29 is activated, transmission gate TG29 is turned on so that the intermediate reference potential of node S29 is applied to the minus terminal of analog subtracting circuit 8. In other words, the output signal from sample and hold circuit 1 is applied to analog subtracting circuit 8 at the same timing as the intermediate reference potential is applied thereto through switch group 5a. Since transmission gates TG100 and TG29 operate simultaneously in response to the clock signal applied from clock generator 6, both of the transmission gates TG100 and TG29 are subjected to the influence of the feed through caused by the clock signal, which enables production of a more accurate input signal for lower comparison. Consequently, the accuracy of lower comparing operation can be improved so that analog signals can be converted into digital signals more accurately.

Figure 5:
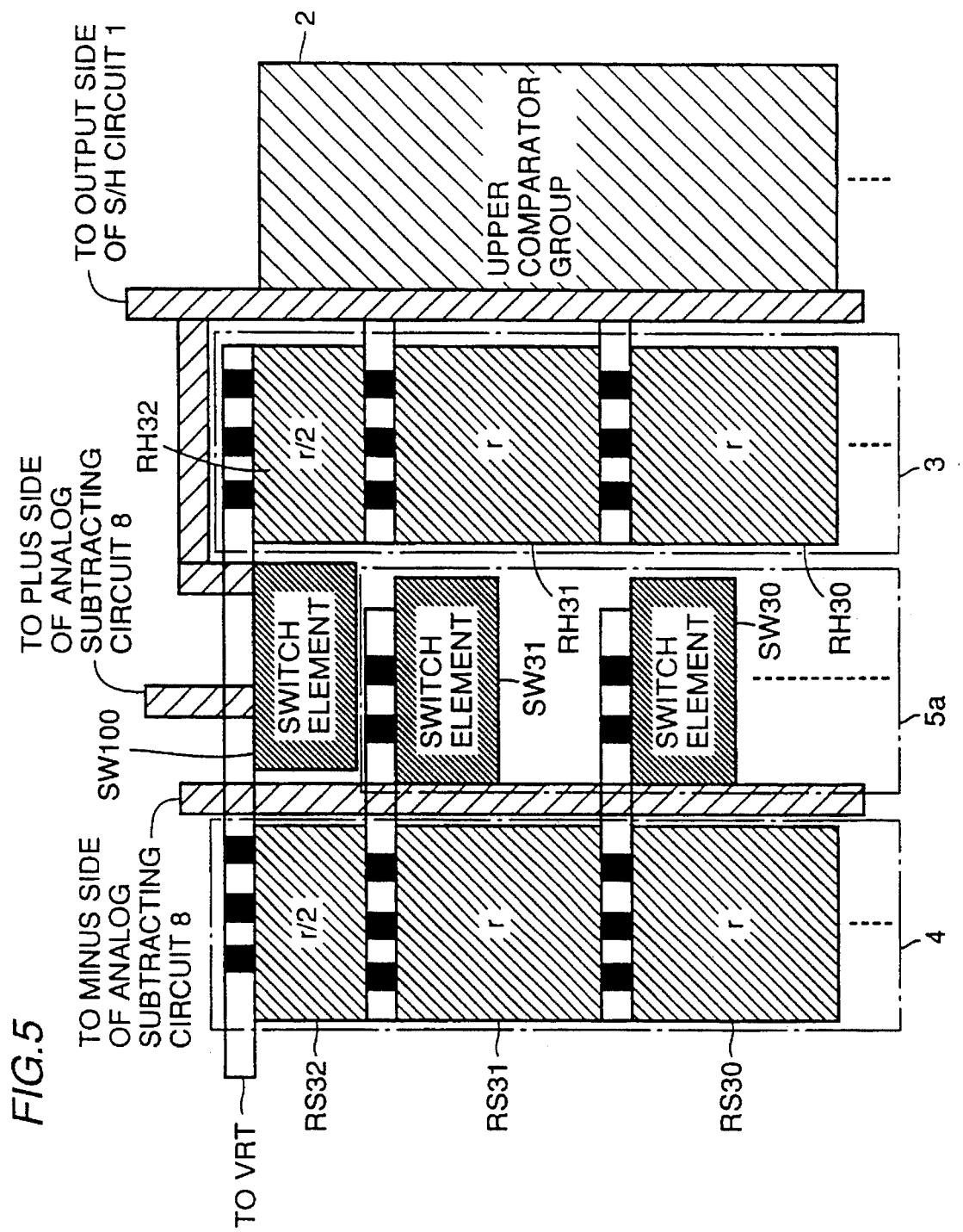
FIG. 5 is a layout showing a major portion of an A-D converter according to the fifth embodiment of the present invention.

An A-D converter according to the fifth embodiment of the present invention will now be described referring to the drawings. FIG. 5 is a layout showing a major portion of the A-D converter according to the fifth embodiment of the present invention. Since the A-D converter shown in FIG. 5 is similar in structure to that shown in FIG. 3, the same numerals are given to the identical portions and description thereof will not be repeated.

In FIG. 5, a switch element 100 includes transmission gate TG100 shown in FIG. 3 and switch element 31 includes transmission gate TG31 and inverter circuit G31. The other switch elements are similar to switch element SW31. Switch element SW100 is disposed in the vicinity of switch group 5a, and in this embodiment it is placed between ladder resistance network 4 and upper ladder resistance network 3.

Ladder resistance network 4 and upper ladder resistance network 3 receive predetermined potentials VRT and VRB for generating heat. The heat has an influence on the characteristics of switch elements SW0–SW31 included in switch group 5a disposed in the vicinity of ladder resistance network 4. As shown in FIG. 5, being placed in the vicinity of switch group 5a, switch element SW100 is also subjected to the heat generated from ladder resistance network 4 and upper ladder resistance network 3. Accordingly, switch element SW100 and switch elements SW0–SW31 included in switch group 5a are subjected to the similar influence of the heat, thus they come to have the same characteristics. Therefore, analog subtracting circuit 8 receives the signals through the switch elements of the same characteristic, so that it can produce a more accurate input signal for lower comparison. By using such input signal for lower comparison for carrying out the lower comparing operation, the analog signal can be converted into the digital signal more accurately.

Figure 6:
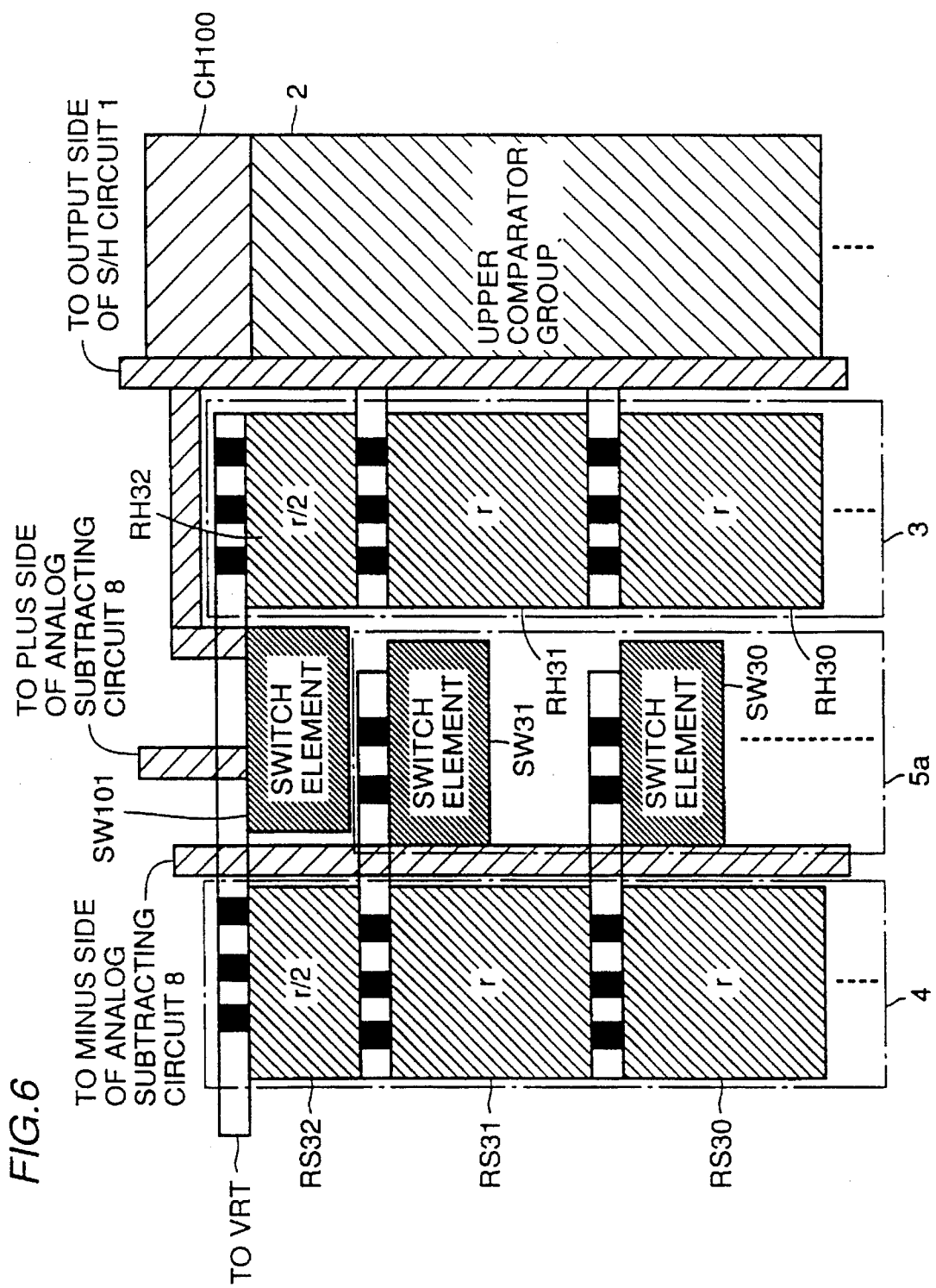
FIG. 6 is a layout showing a major portion of an A-D converter according to the sixth embodiment of the present invention.

An A-D converter according to the sixth embodiment of the present invention will now be described referring to the drawings. FIG. 6 is a layout showing a major portion of the A-D converter according to the sixth embodiment of the present invention. As the A-D converter shown in FIG. 6 is similar in structure to that shown in FIG. 4, the same numerals are given to the identical portions and the description thereof will not be repeated.

In FIG. 6, a switch element SW101 includes transmission gate TG100 and inverter circuit G100 shown in FIG. 4 and switch element SW31 includes transmission gate TG31 and inverter circuit G31. The other switch elements are similar to switch element SW31.

Switch element SW101 is disposed between ladder resistance network 4 and upper ladder resistance network 3 and comparator CH100 is disposed in the vicinity of upper comparator group 2. As in the fifth embodiment, switch element SW101 and comparator CH100 are subjected to the thermal influence similarly to switch group 5a and upper comparator group 2 and thus come to have the same characteristic. Analog subtracting circuit 8 receives the signals via the switch elements of the same characteristic, so that it can produce a more accurate input signal for lower comparison. By using such input signal for lower comparison for carrying out the lower comparing operation, analog signals can be converted into digital signals more accurately.

Figure 7:
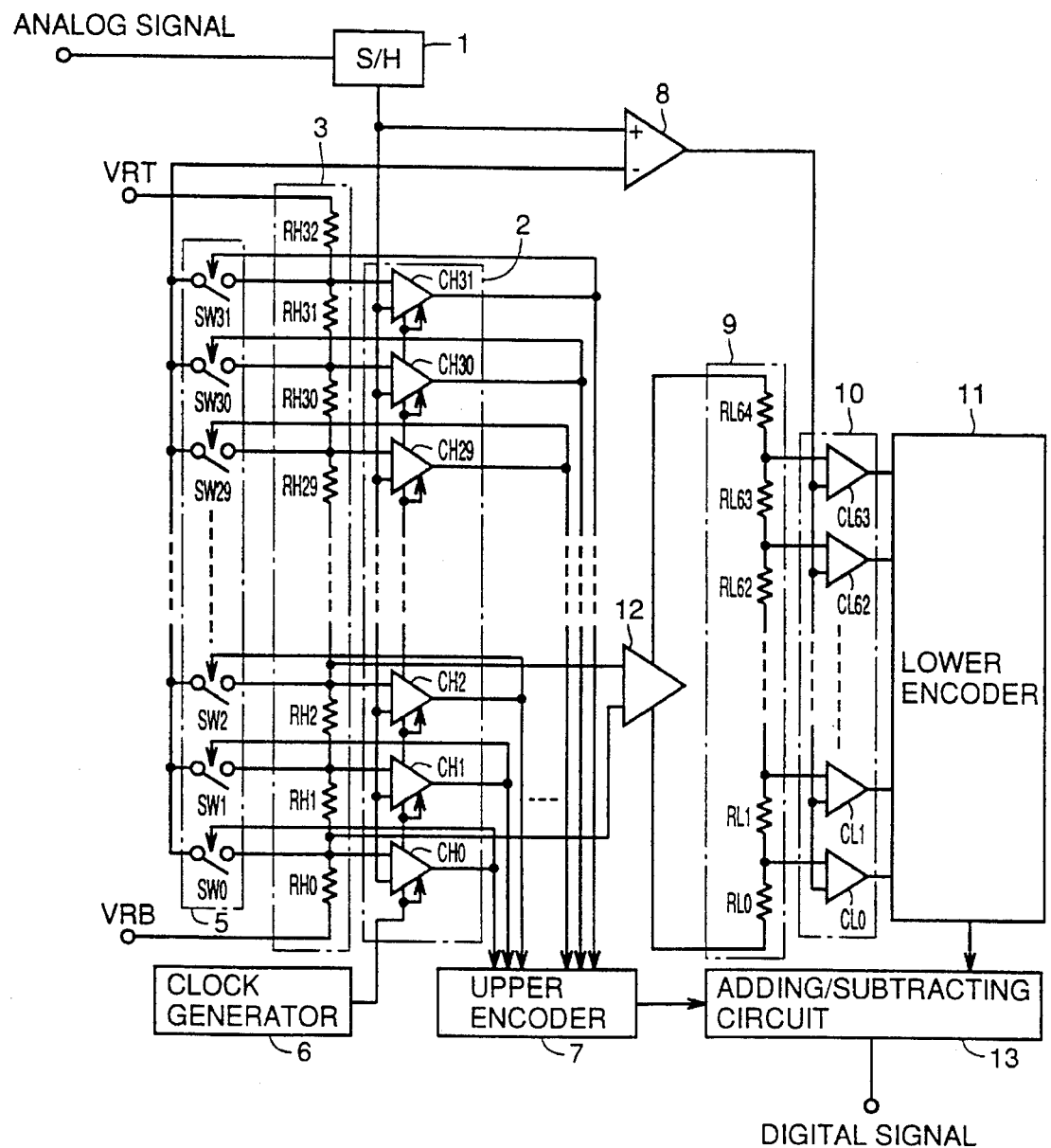
FIG. 7 shows a structure of an A-D converter according to the seventh embodiment of the present invention.

An A-D converter according to the seventh embodiment of the present invention will now be described referring to the drawings. FIG. 7 shows a structure of the A-D converter according to the seventh embodiment of the present invention.

FIG. 7 shows the same A-D converter as that shown in FIG. 2 except that ladder resistance network 4 is not provided and that switch group 5 is directly connected to upper ladder resistance network 3.

Since the A-D converter is structured as above, the upper reference potentials generated from upper ladder resistance network 3 are directly applied to analog subtracting circuit 8 via switch group 5. Also, the upper reference potentials are directly applied to differential amplifying circuit 12 which in turn outputs the voltage of 2LSBs to lower ladder resistance network 9. The other operations are similar to those in the A-D converter shown in FIG. 2 and the description thereof will not be repeated.

In the A-D converter shown in FIG. 7, the structure of the circuitry is simplified by using only upper ladder resistance network 3, eliminating ladder resistance network 4 shown in FIG. 2, so that high integration of the device can be easily accomplished.

By the seventh embodiment, the similar effect can be obtained by adding the switch elements as in the third to sixth embodiments.

Although the 10-bit A-D converter has been described in the above embodiments, the other bit structure can be applied thereto for obtaining the similar effect.

Figure 10:
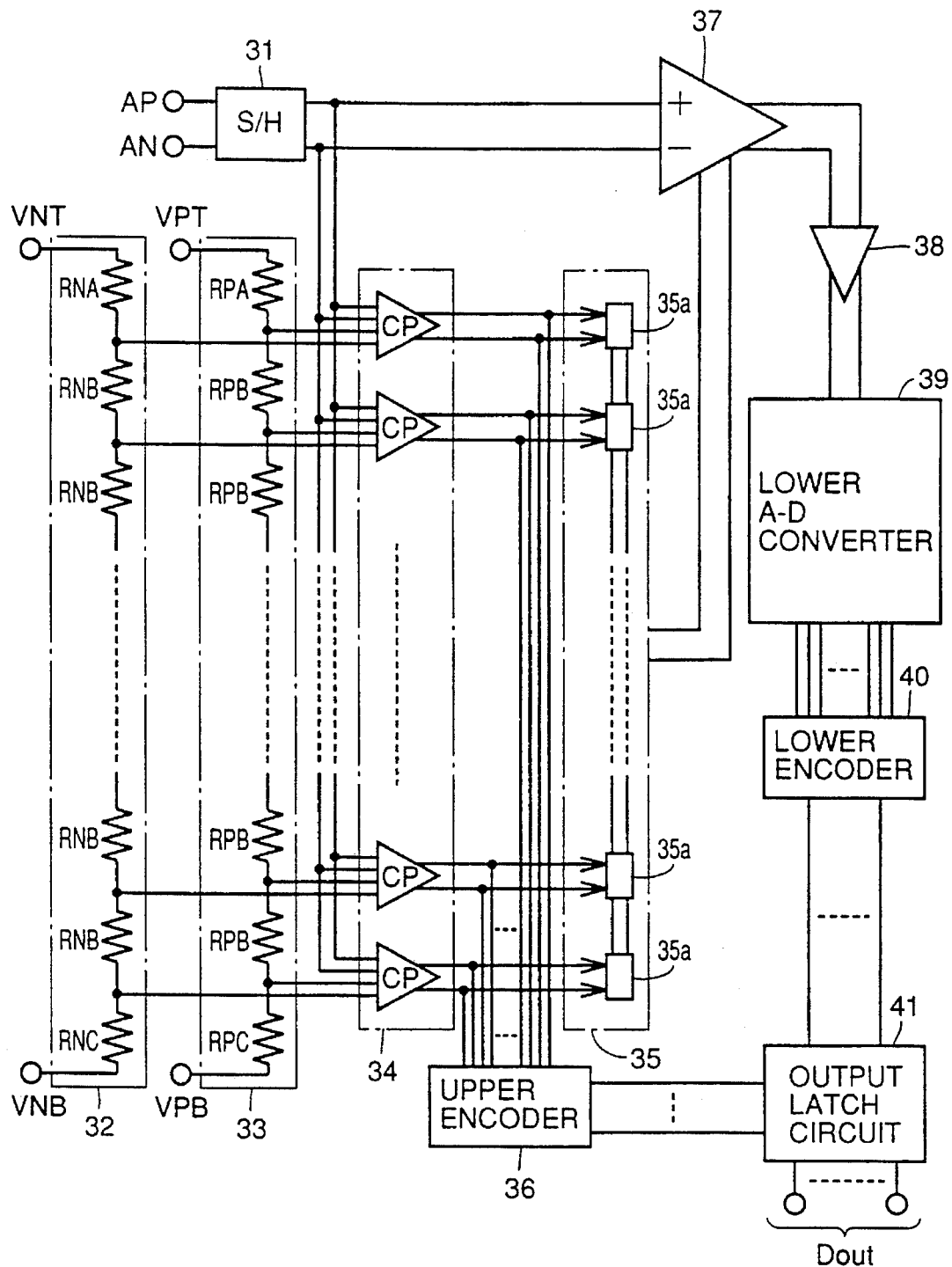
FIG. 10 shows a structure of an A-D converter according to an eighth embodiment of the present invention.

Now, an A-D converter according to a eighth embodiment of the present invention will be described with reference to the drawings. FIG. 10 shows a structure of the A-D converter according to the eighth embodiment of the present invention.

In FIG. 10, the A-D converter includes a sample and hold circuit 31, a negative upper ladder resistance network 32, a positive upper ladder resistance network 33, an upper comparator group 34, a D-A converter 35, an upper encoder 36, an analog subtracting circuit 37, a differential amplifier 38, a lower A-D converter 39, a lower encoder 40, and an output latch circuit 41. Differential analog signals AP, AN are respectively input to sample and hold circuit 31. Sample and hold circuit 31 extracts and samples instantaneous values of the applied differential analog signals AP, AN, holds those values for a certain time period, and outputs those values to upper comparator group 34 and analog subtracting circuit 37, respectively.

Negative upper ladder resistance network 32 includes a series-connected plurality of resistances RNA, RNB, RNC. A resistance value of resistances RNA, RNC at both ends of negative upper ladder resistance network 32 is r/2 (r is a prescribed value), and a resistance value of the other resistances RNBs is r. Predetermined negative voltages VNT, VNB are applied on both ends of negative upper ladder resistance network 32. For example, assume a comparison operation of the upper m bits (m is a prescribed integer) is carried out, then, a voltage between negative voltages VNT and VNB will be n×m (V), wherein n is a voltage of 1LSB of the upper comparison operation. Thus, a reference potential output from a node between resistances RNA and RNB will be a potential shifted by a voltage of ½ LSB from the potential of negative voltage VNT. In the same manner, a potential shifted from the potential of VNT by a voltage of 3/2 LSB, a potential shifted by a voltage of 5/2 LSB and so on are generated respectively from each node between resistances RNA and RNB. Finally, a potential shifted by a voltage of (m–½) LSB is applied from a node between resistances RNB and RNC to upper comparator group 34 as an upper reference potential.

Positive upper ladder resistance network 33 includes a series-connected plurality of resistances RPA, RPB, RPC. A resistance value of resistances RPA, RPC at both ends of positive upper ladder resistance network 33 is r/2, and a resistance value of the other resistances RPBs is r. A predetermined positive voltages VPT, VPB are applied on both ends of positive upper ladder resistance network 33. A voltage between positive voltages VPT and VPD is n×m (V) as above. Thus, a potential which is shifted by ½ LSB from positive voltage VPB is generated as a positive upper reference voltage and output from a node between resistances RPB and RPC, and thereafter, the respective potentials which are shifted by 1LSB in turn are output to upper comparator group 34.

Upper comparator group 34 includes a plurality of comparators CPs. Each comparator CP responds to a clock signal output from a clock generator (not shown) and compares the differential output signals from sample and hold circuit 31 with positive and negative upper reference potentials applied from positive and negative upper ladder resistance networks 33, 32, respectively. For instance, each comparator CP outputs a positive upper comparison result signal at a potential "H" level to D-A converter 35 and upper encoder 36 when the positive differential analog input signal is greater than the positive upper reference potential, while each comparator CP outputs a signal at a "L" level when the input signal is smaller. Also, each comparator CP outputs a negative upper comparison result signal at the "H" level to D-A converter 35 and upper encoder 36 when the negative differential analog signal is smaller than the negative upper reference potential, while each comparator CP outputs a signal at the "L" level when the input signal is larger.

D-A converter 35 includes a plurality of constant current source cells 35a. Each constant current source cell 35a responds to the applied upper and lower comparison result signals and outputs a current I corresponding to 1LSB of the upper comparison operation to the positive or negative side. Current I output from each constant current source cell 35a is added in the positive and negative sides, respectively, and output to analog subtracting circuit 37.

Analog subtracting circuit 37 subtracts the positive and negative D-A conversion result signals applied from DA converter 35, respectively from differential analog input signals AP, AN applied from sample and hold circuit 31, and outputs the lower differential analog signals within the range of 1LSB to differential amplifier 38.

Differential amplifier 38 amplifies the applied lower differential analog signals and outputs those amplified signals to lower A-D converter 39.

Lower A-D converter 39 includes a negative lower ladder resistance network, a positive lower ladder resistance network, and a lower comparator group, each of which being similar to negative upper ladder resistance network 32, positive upper ladder resistance network 33, and upper comparator group 34 provided for the upper comparison. Lower A-D converter 39 compares the applied lower differential analog signals with the positive and negative lower reference potentials, as in the upper comparison operation, and outputs those comparison results to lower encoder 40 as the lower comparison result signals.

Upper and lower encoders 36, 40 encode the applied upper and lower comparison result signals, respectively, by a prescribed logical processing, and output the upper and lower digital code signals to output latch circuit 41.

Output latch circuit 41 latches the applied upper and lower digital code signals and outputs digital signals Dout corresponding to differential analog input signals AP, AN.

Figure 11A:
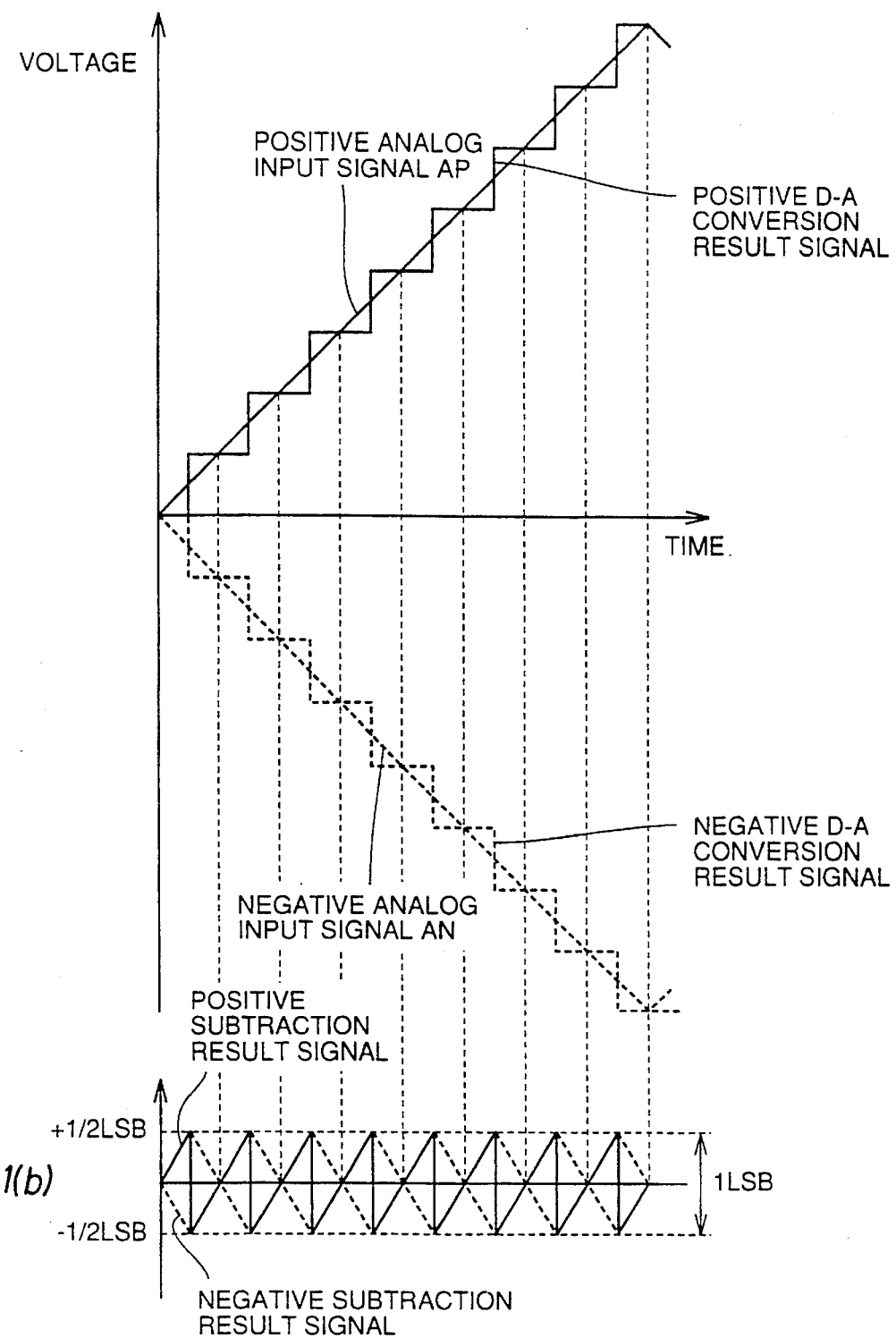
FIGS. 11(a) and 11(b) are graphs showing a subtraction result by the analog subtracting circuit shown in FIG. 10.
Figure 11B:
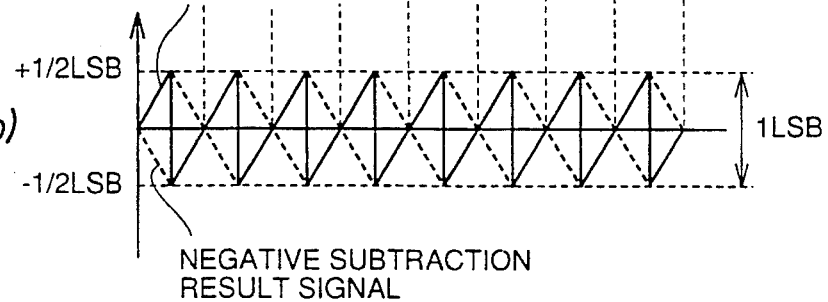

Now, a detailed description will be made on a subtracting operation by the analog subtracting circuit shown in FIG. 10. FIGS. 11(a) and 11(b) show the subtraction result by the analog subtracting circuit shown in FIG. 10.

Positive and negative analog input signals AP, AN are compared with the positive and negative upper reference potentials which are shifted by a voltage of ½ LSB as described above, so that the positive and negative D-A conversion result signals output from D-A converter 35 will be as shown in FIGS. 11(a) and 11(b). When respective positive and negative D-A conversion result signals are subtracted from positive and negative analog input signals AP, AN, respectively, the positive and negative subtraction result signals are equally divided upwards and downwards about the reference potential, thus included within the range of the voltage of 1LSB as a whole. As a result, the range of the positive and negative subtraction result signals becomes half the conventional range.

Figure 12A:
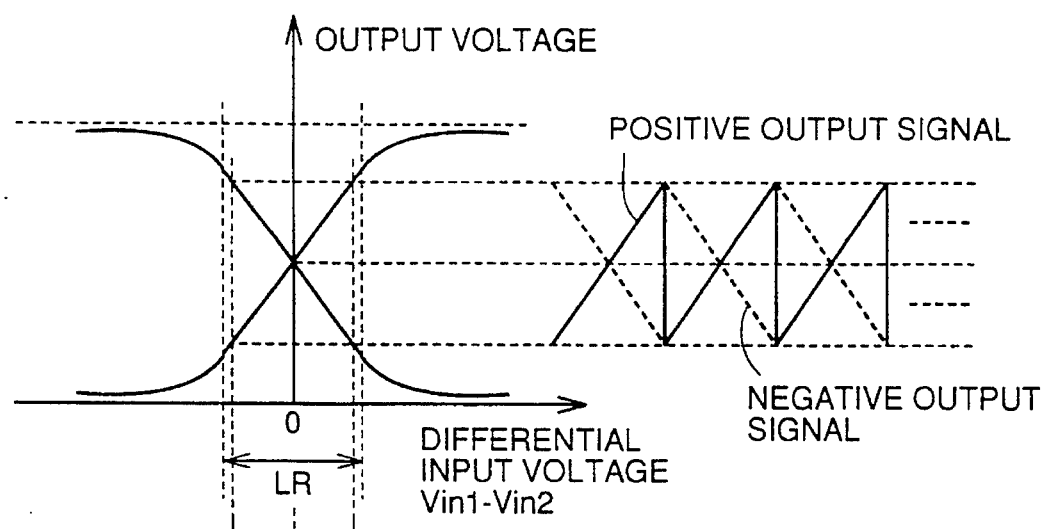
FIGS. 12(a) and 12(b) are graphs showing an amplification result by the differential amplifier shown in FIG. 10.
Figure 12B:
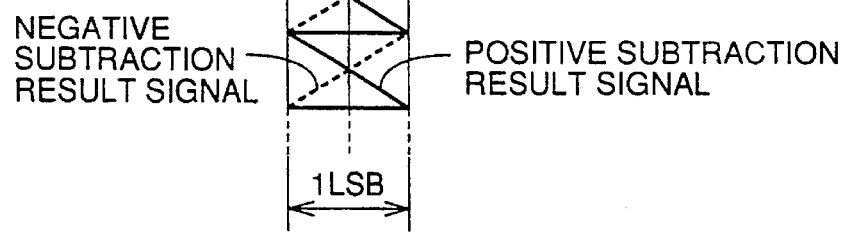

Next, the amplification result of the positive and negative subtraction result signals by the differential amplifier will be described in detail. FIGS. 12(a) and 12(b) show the amplification result by the differential amplifier shown in FIG. 10.

With reference to FIGS. 12(a) and 12(b), the positive and negative subtraction result signals are in the range of the voltage of 1LSB as a whole relative to the reference potential, and since the range is ½ of the conventional range, it is included in linear area LR of the differential amplifier. Therefore, positive and negative output signals are amplified linearly to have a superior linear characteristic. In other words, amplification can be carried out only within the linear range of the differential amplifier by reducing the range of the input signals of the differential amplifier to ½ of the conventional range, thus allowing the highly accurate amplifying operation.

When the above-described A-D converter is fabricated in practice, the measurement results of the linearity error as follows. For instance, assume the resistance value of resistances RPA, RPC, RNA, RNC is 7.8125õ and the resistance value of the other resistances 15.625õ, if an output of 0.9 Vpp is obtained relative to an input of 1 V, the linearity error is 0.76 mVpp and an error with respect to the output signal is ±0.042%. Thus, the very accurate amplifying operation can be achieved.

By implementing the lower A-D converting operation by lower A-D converter 39 using the positive and negative output signals obtained through the above amplifying operation as the lower differential analog signals, the highly accurate lower digital signals can be obtained. Also, in the present embodiment, such a result can be obtained only by adjusting the resistance values without increasing the number of elements, which is preferable for high integration. Further, the highly accurate A-D converting operation can be implemented in a very simple structure without any cost increase due to additional manufacturing steps or components.

Figure 13:
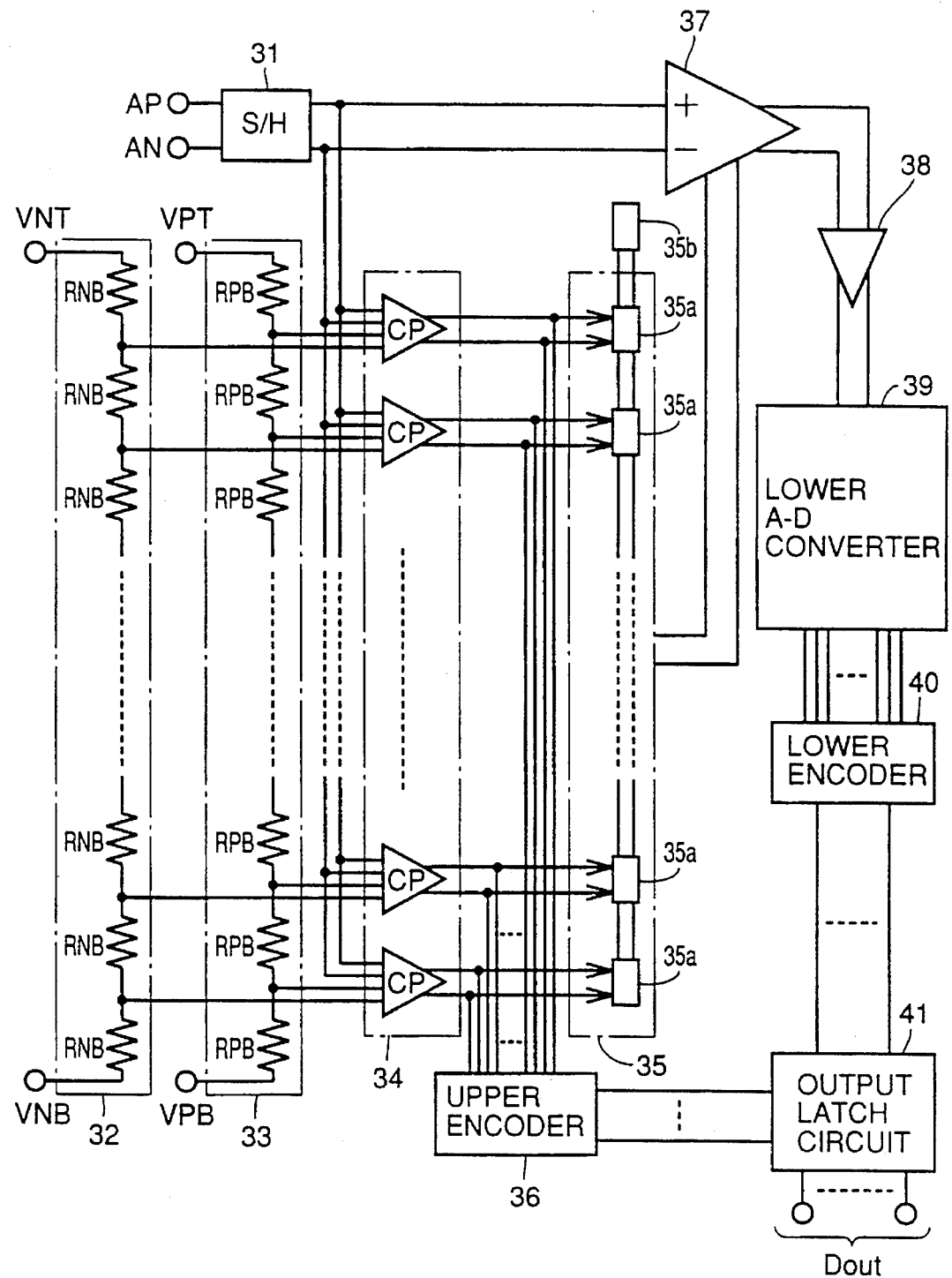
FIG. 13 shows a structure of an A-D converter according to a ninth embodiment of the present invention.

Now, an A-D converter according to a ninth embodiment of the present invention will be described with reference to the drawings. FIG. 13 shows a structure of the A-D converter according to the ninth embodiment of the present invention.

The A-D converter shown in FIG. 13 is different from that shown in FIG. 10 in that a constant current source cell 35b is added to D-A converter 35, and that every resistance value of respective resistances RPB, RNB in positive and negative upper ladder resistance networks 33, 32 is set to r. The other parts are the same as the A-D converter shown in FIG. 10 so that the description thereof will not be repeated below.

Since each resistance value of positive and negative ladder resistance networks 33, 32 is r as described above, positive upper ladder resistance network 33 outputs upper reference potentials obtained by division of the voltage between VPB and VPT by 1LSB of the upper comparison operation, and similarly, negative upper ladder resistance network 32 outputs positive upper reference potentials obtained by division of the voltage between VNT and VNB by 1LSB. In positive and negative upper ladder resistance networks 33, 32, therefore, the potential of ½ LSB is not shifted, unlike the A-D converter shown in FIG. 10. Instead, in the A-D converter shown in FIG. 13, positive and negative D-A conversion result signals which are output from D-A converter 35 are shifted by ½ LSB by virtue of addition of constant current source cell 35b.

Figure 14:
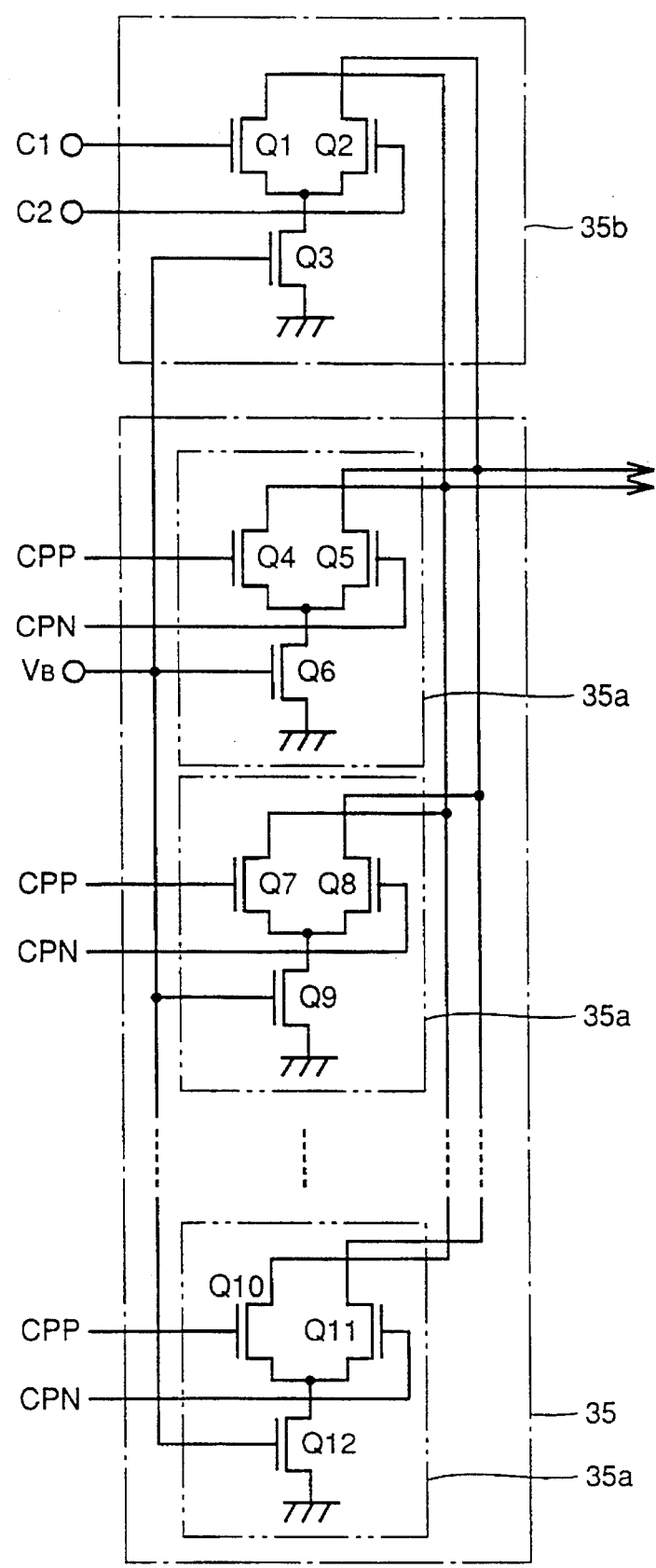
FIG. 14 is a circuit diagram showing a structure of the D-A converter shown in FIG. 13.

D-A converter shown in FIG. 13 will be described in detail. FIG. 14 is a circuit diagram showing a structure of D-A converter shown in FIG. 13.

With reference to FIG. 14, D-A converter 35 includes a plurality of constant current source cells 35a, the number of which being corresponding to the number of the plurality of comparators CP, and constant current source cell 35b is newly included.

Constant current source cell 35a includes NMOS transistors Q4–Q6. Transistor Q4 is connected to transistors Q5 and Q6 and receives a positive upper comparison result signal CPP from a corresponding comparator CP at its gate. Transistor Q5 receives a negative upper comparison result signal CPN from a corresponding comparator CP at its gate. Transistor Q6 receives a prescribed bias voltage $V_B$ at its gate. Bias voltage $V_B$ may be internally applied in the A-D converter or may be supplied directly from the external of the converter. In each constant current source cell 35a, when positive upper comparison result signal CPP applied from corresponding comparator CP is at "H" and negative upper comparison result signal CPN is at "L", transistor Q4 is turned on and transistor Q5 is turned off. As a result, current I corresponding to 1LSB of the upper A-D converting operation is output from transistor Q6 through transistor Q4 as a positive D-A conversion result signal. On the other hand, when signal CPP is at "L" and signal CPN is at "H", transistor Q4 is turned off and transistor Q5 is turned on. Consequently, the above current I is output from transistor Q6 through transistor Q5 as a negative D-A conversion result signal. The other constant current source cells 35a are in the same structure.

Figure 15A:
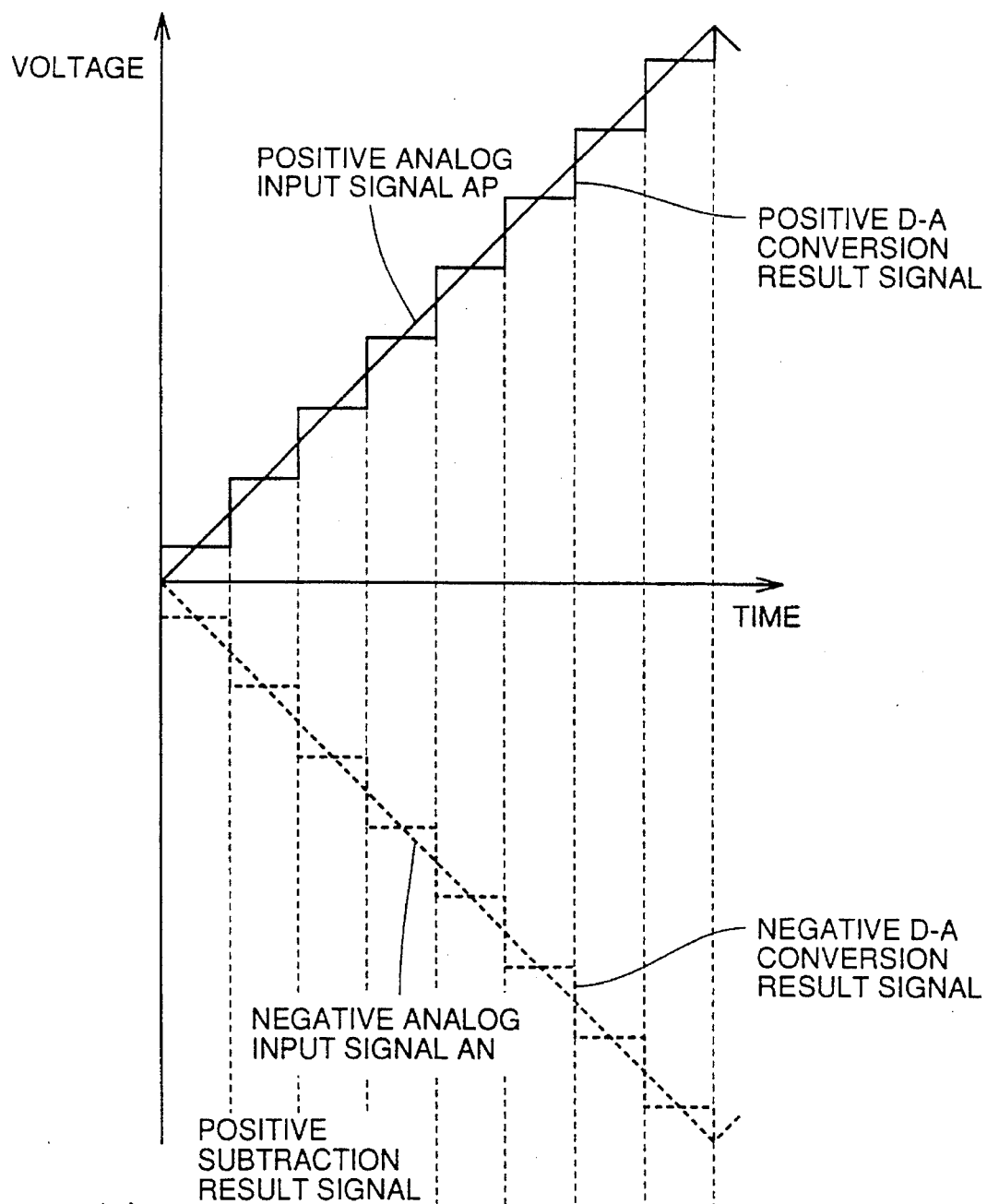
FIGS. 15(a) and 15(b) are graphs showing a subtraction result by the analog subtracting circuit shown in FIG. 13.
Figure 15B:
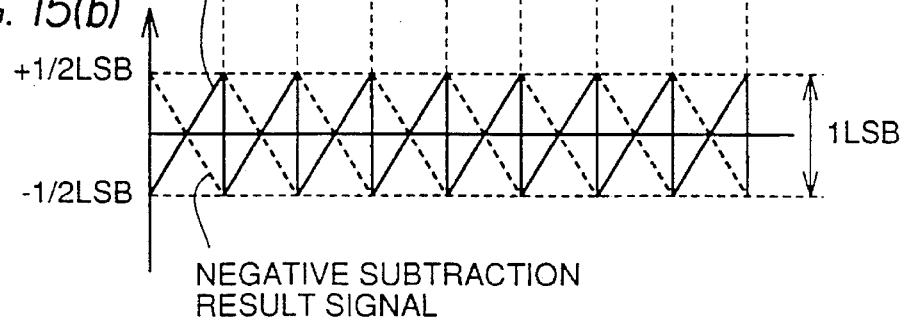

Constant current source cell 35b includes NMOS transistors Q1–Q3. Transistor Q1 is connected to transistors Q2 and Q3 and receives a control signal C1 of an intermediate potential level at its gate. Transistor Q2 receives a control signal C2 of the intermediate potential level at its gate. Bias voltage $V_B$ is supplied to the gate of transistor Q3 as in constant current source cell 35a. It is noted that transistor Q3 is of the same size as transistors Q6–Q12 and transistors Q1 and Q2 are of the same size. Thus, if transistors Q1 and Q2 are turned on, current I generated from transistor Q3 is equally divided to flow through transistor Q1 and Q2. Transistors Q1 and Q2 are connected to D-A converter 35 and add a current I/2 corresponding to ½ LSB to the current output from D-A converter 35. More particularly, the current which is shifted by ½ LSB from the current corresponding to positive and negative comparison result signals CPP, CPN applied from comparator CP is output from D-A converter 35 into analog subtracting circuit 37. The subtraction result by analog subtracting circuit 37 is as shown in FIG. 15(a) and 15(b). With reference to FIGS. 15(a) and 15(b), positive and negative D-A conversion result signals are shifted by ½ LSB so that positive and negative subtraction result signals are within the range of 1LSB as in FIGS. 11(a) and 11(b). As described above, in the ninth embodiment, lower differential analog signals can be supplied to lower A-D converter 39 with only using the linear range of the input/output characteristics of differential amplifier 38, as in the A-D converter shown in FIG. 10. This improves accuracy of the lower comparison operation.

Figure 16:
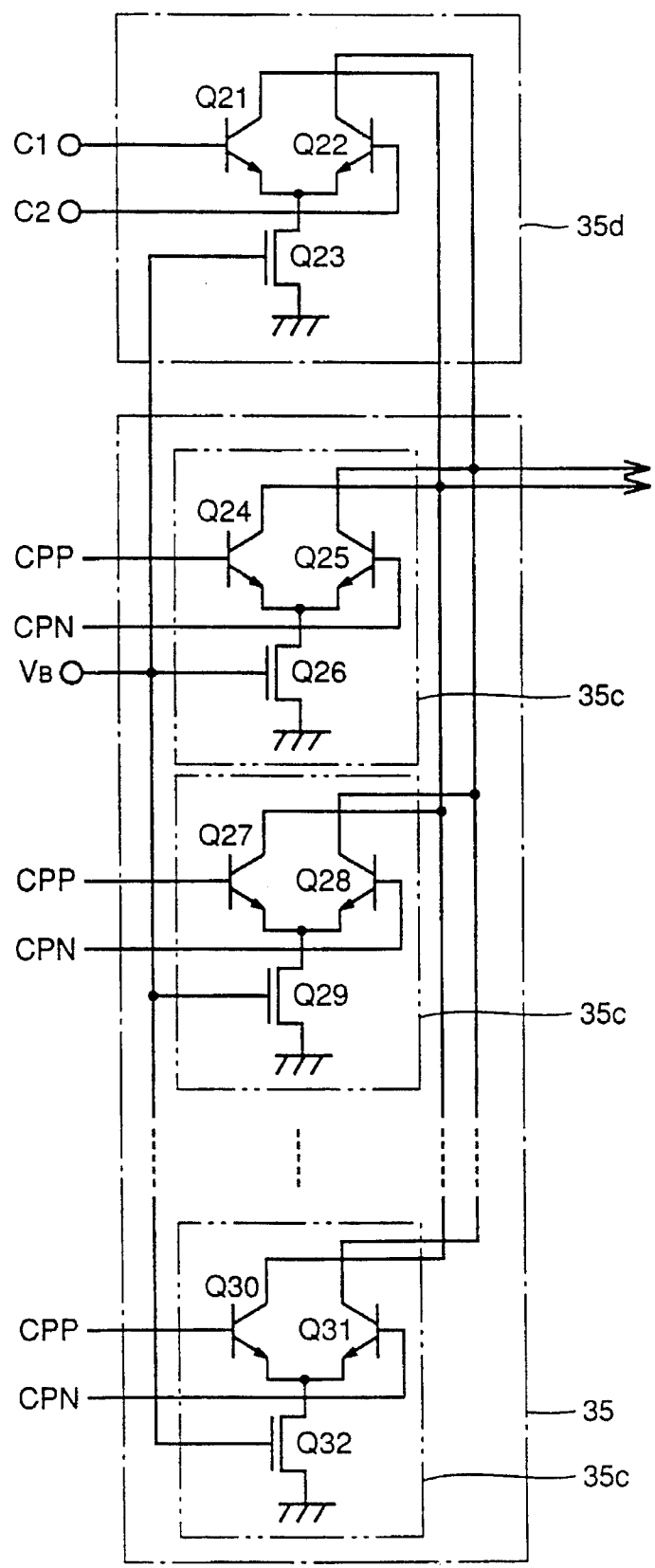
FIG. 16 is a circuit diagram showing another structure of the D-A converter shown in FIG. 13.

Now, another structure of the D-A converter shown in FIG. 13 will be described. FIG. 16 is a circuit diagram showing another structure of the D-A converter shown in FIG. 13.

In FIG. 16, D-A converter 35 includes a plurality of constant current source cells 35c and a constant current source cell 35d is added thereto.

With reference to FIGS. 14 and 16, constant current source cell 35d is different from cell 35b in that bipolar transistors Q21, Q22 are employed instead of NMOS transistors Q1, Q2. The other parts and operations are the same as constant current source cell 35b shown in FIG. 14 so that the description thereof will not be repeated. Constant current source cell 35c is different from cell 35a in that bipolar transistors Q24, Q25 are employed instead of NMOS transistors Q4, Q5. The other parts and operations are the same as in constant current source cell 35a shown in FIG. 14 so that the description thereof will not be repeated.

In the D-A converter shown in FIG. 16, positive and negative D-A conversion result signals which are output in response to positive and negative upper comparison result signals applied from comparator CP are shifted by ½ LSB for output to analog subtracting circuit 37, as in the D-A converter shown in FIG. 14. Therefore, accurate lower differential analog signals can be output from differential amplifier 38 as in the above, so that the accuracy of the lower comparing operation is improved and the highly accurate A-D converting operation can be carried out.

Figure 17:
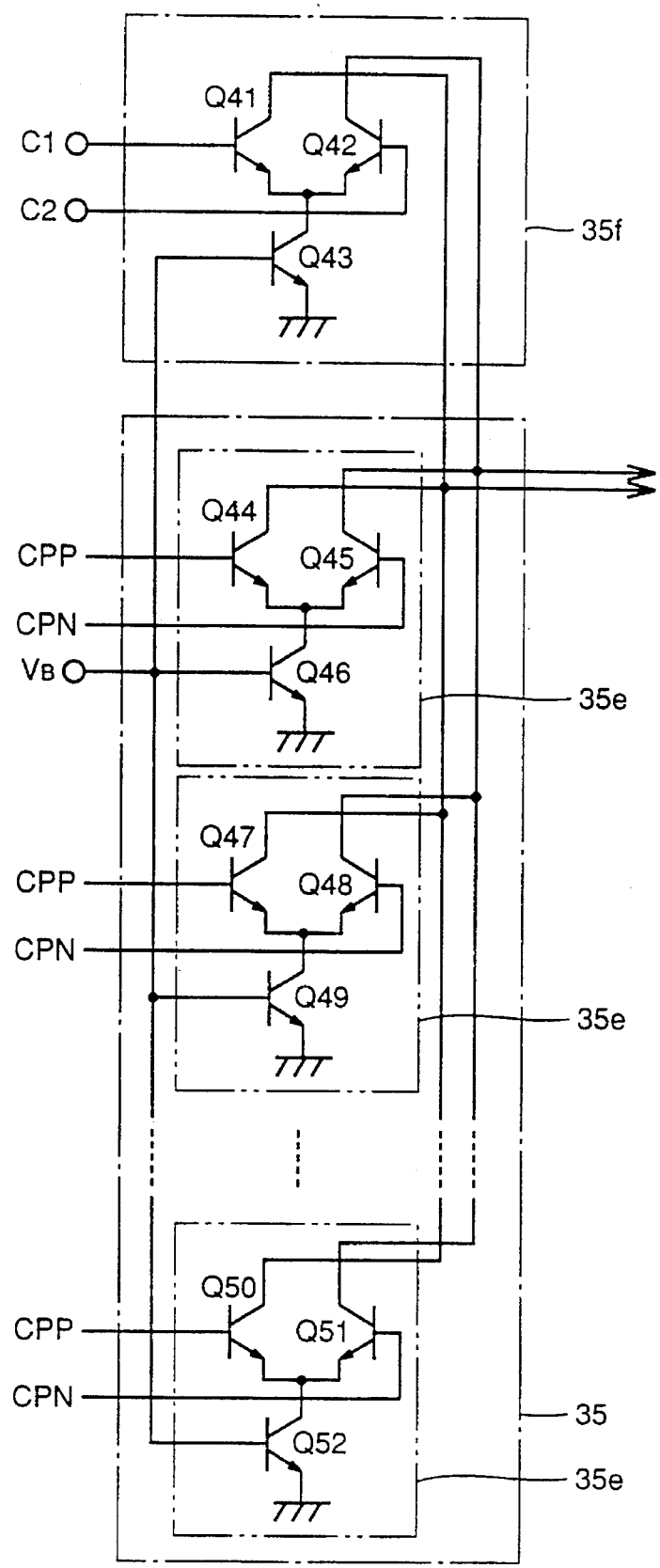
FIG. 17 is a circuit diagram showing still another structure of the D-A converter shown in FIG. 13.

Still another structure of the D-A converter shown in FIG. 13 will be described. FIG. 17 is a circuit diagram showing still another structure of the D-A converter shown in FIG. 13.

Only bipolar transistors are employed in the D-A converter shown in FIG. 17. Connections and operations of the D-A converter shown in FIG. 17 is the same as in the D-A converter shown in FIG. 14 so that the description thereof will not be repeated.

Also in the D-A converter shown in FIG. 17, positive and negative D-A conversion result signals which are shifted by ½ LSB in response to positive and negative upper comparison result signals applied from comparator CP are output to analog subtracting circuit, so that the highly accurate A-D converting operation can be implemented as above.

Figure 18:
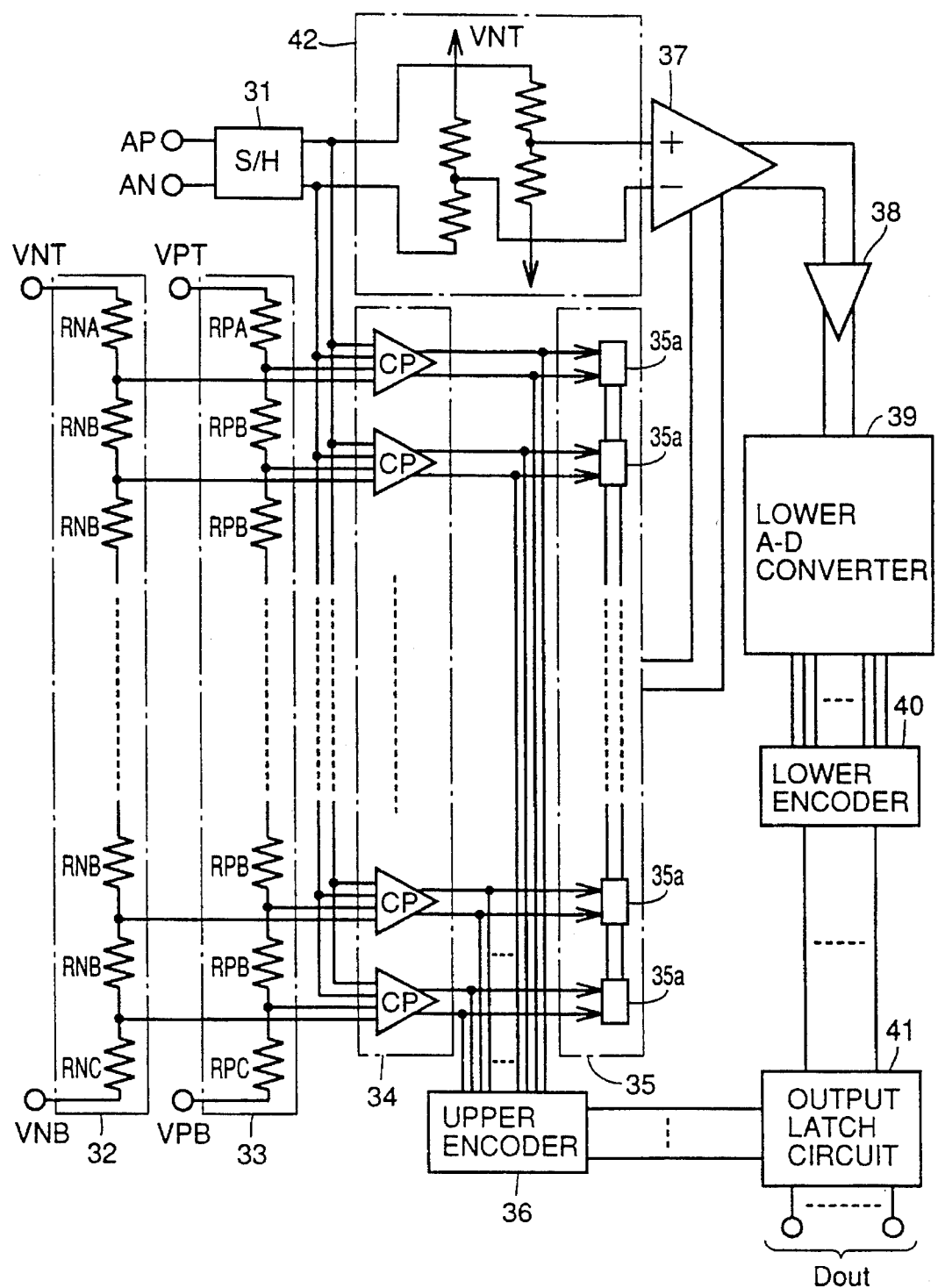
FIG. 18 shows a structure of an A-D converter according to a tenth embodiment of the present invention.

Now, an A-D converter according to a tenth embodiment of the present invention will be described with reference to the drawings. FIG. 18 shows a structure of the A-D converter according to the tenth embodiment of the present invention. The A-D converter shown in FIG. 18 is different from that shown in FIG. 13 in that constant current source cell 35b is excluded while an input voltage shifting circuit 42 is added between sample and hold circuit 31 and analog subtracting circuit 37.

In the A-D converter shown in FIG. 18, positive and negative D-A conversion result signals output from D-A converter 35 are applied to analog subtracting circuit 37 without being shifted by ½ LSB. Instead, the differential analog signals applied to analog subtracting circuit 37 are shifted by ½ LSB by input voltage shifting circuit 42.

With reference to FIG. 18, input voltage shifting circuit 42 includes resistances RPa–RPd, RNa–RNd, and operational amplifiers OPP, OPN. Resistance RPa is connected to a positive reference voltage VP and one terminal of operational amplifier OPP. A negative differential analog signal AN is input to a negative terminal of operational amplifier OPP from sample and hold circuit 31 through resistance RPc. Resistance RPb is connected to the negative terminal and an output terminal of operational amplifier OPP. Resistance RPd is connected to a positive terminal of operational amplifier OPP and the ground potential. Positive reference voltage VP is, for example, VPT–VPB. Resistances RNa–RNd and operational amplifier OPN are similarly connected. A negative reference voltage VN is VNT–VNB.

Figure 19A:
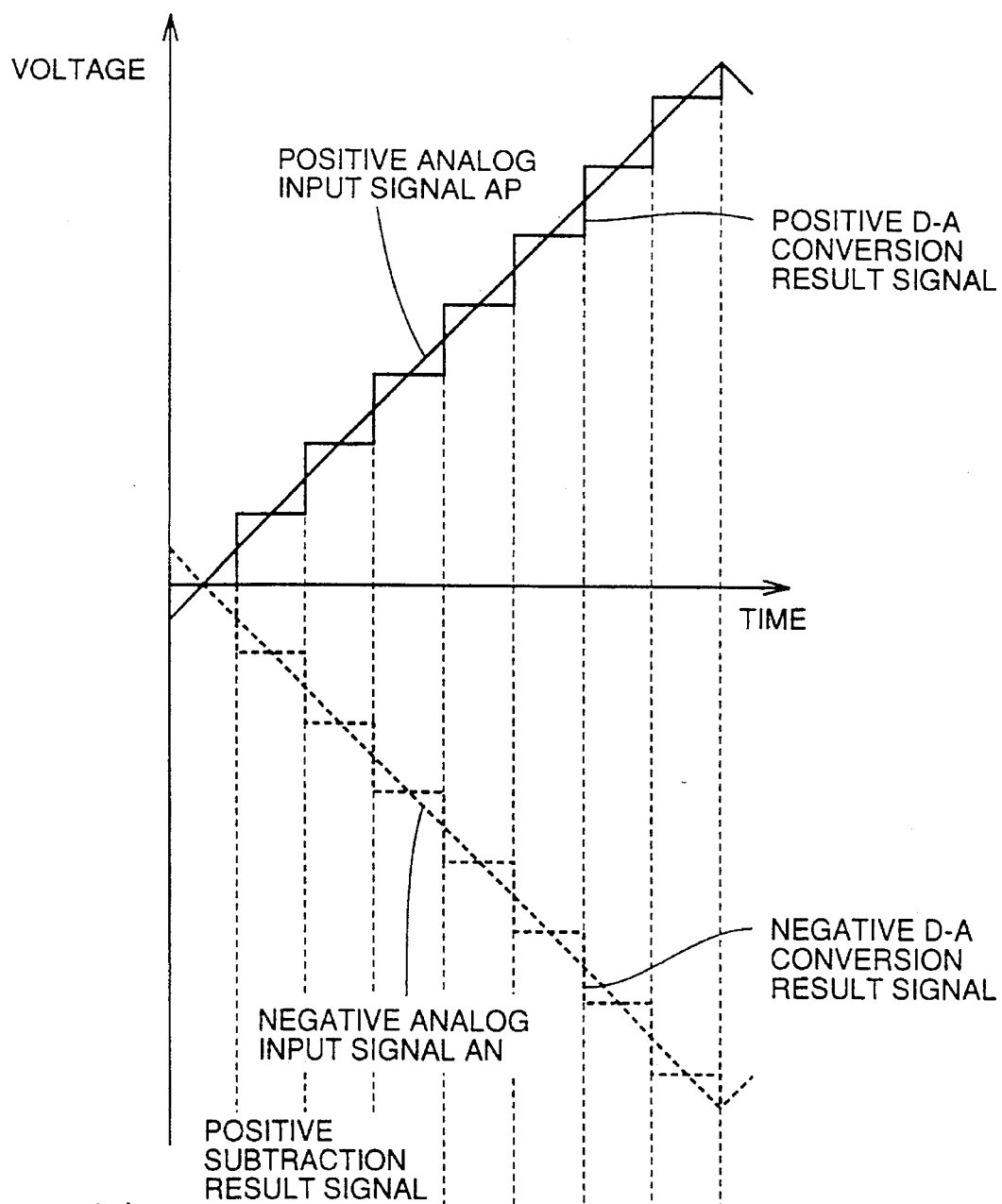
FIGS. 19(a) and 19(b) are graphs showing a subtraction result by the analog subtracting circuit shown in FIG. 18.
Figure 19B:
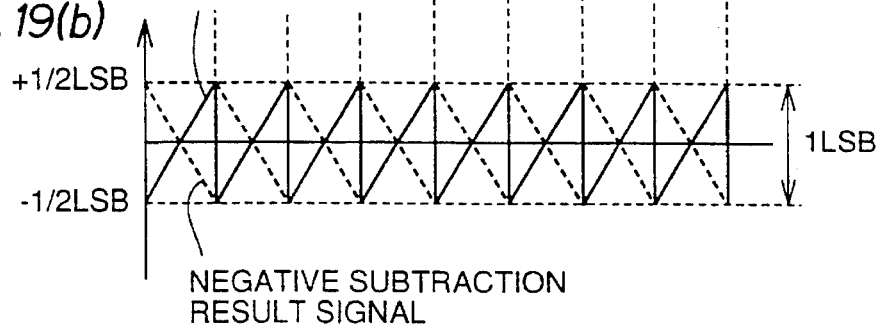
Figure 20:
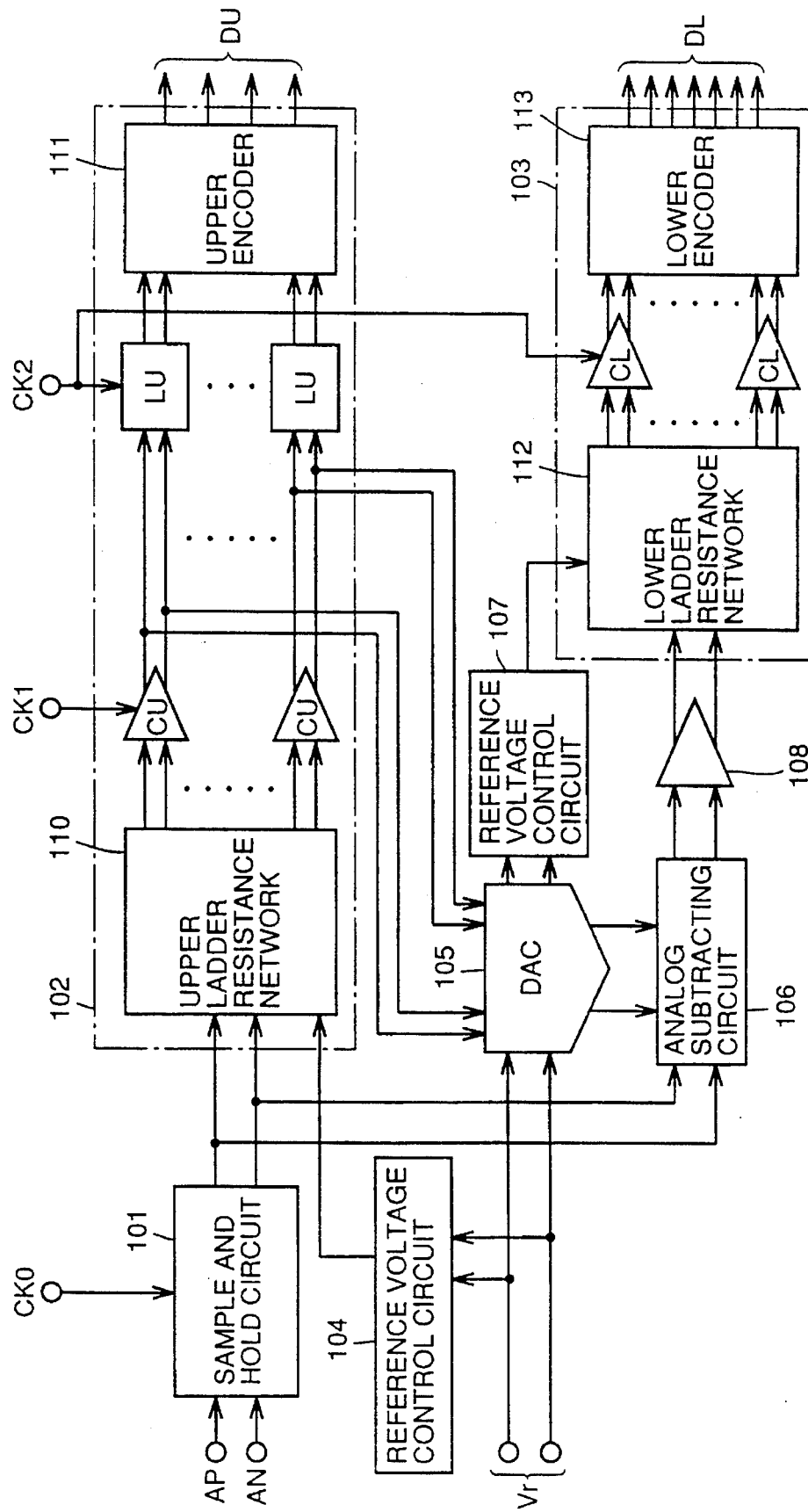
FIG. 20 shows a structure of another conventional A-D converter.
Figure 21A:
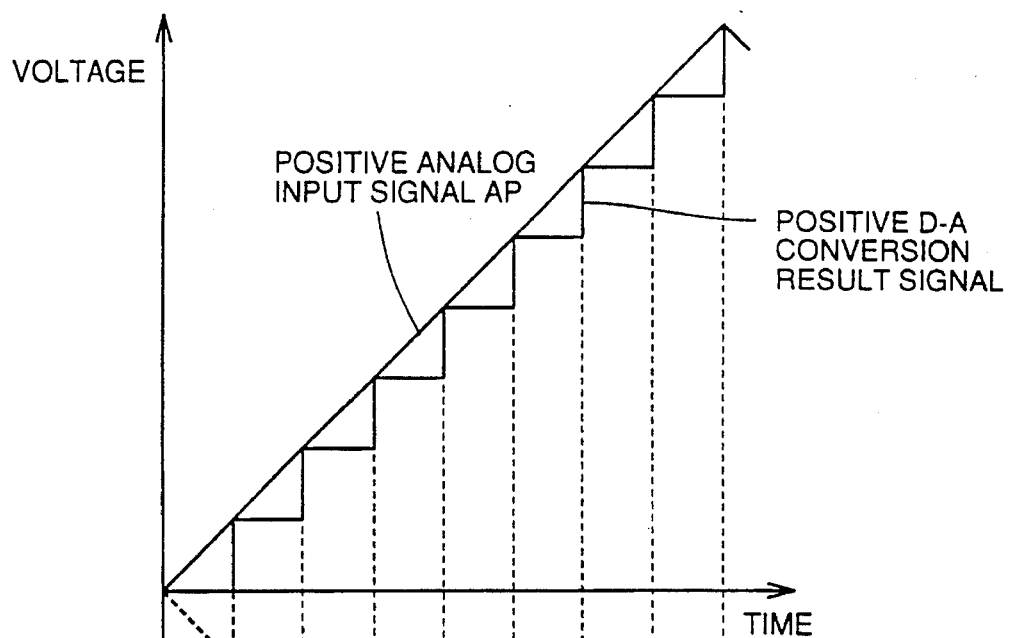
FIG. 21 is a graph showing a subtraction result by the analog subtracting circuit shown in FIG. 20.
Figure 21A:
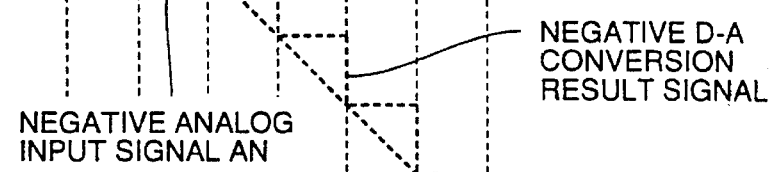
Figure 21B:
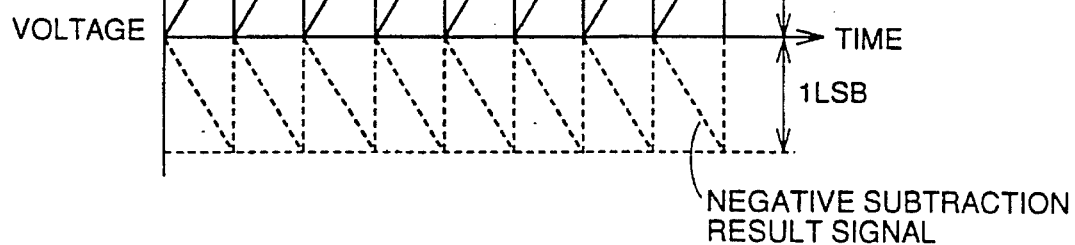
Figure 22:
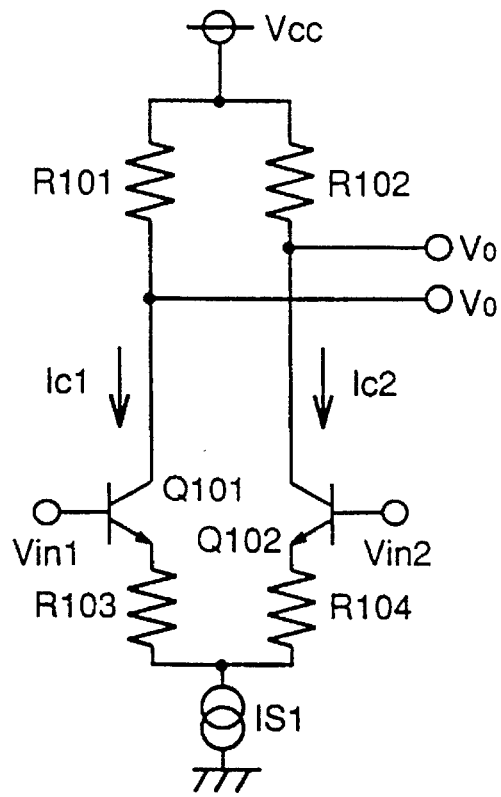
FIG. 22 is a circuit diagram showing a structure of the differential amplifier shown in FIG. 20.
Figure 23:
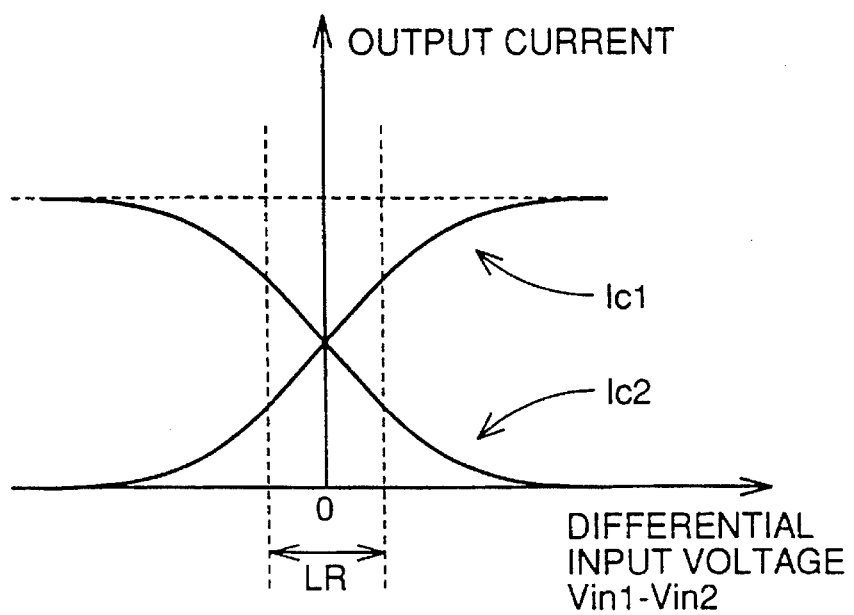
FIG. 23 is a graph showing a relationship between differential input voltage and collector current of the differential amplifier shown in FIG. 20.
Figure 24:
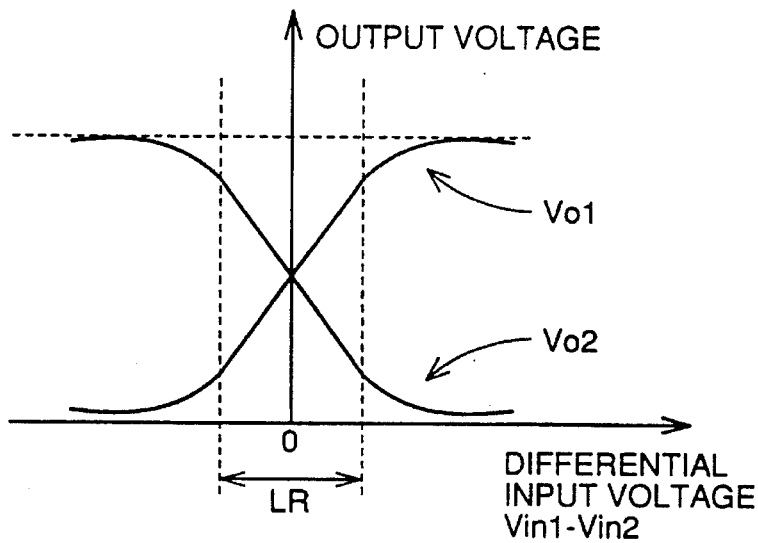
FIG. 24 is a graph showing a relationship between differential input voltage and output voltage of the differential amplifier shown in FIG. 20.
Figure 25A:
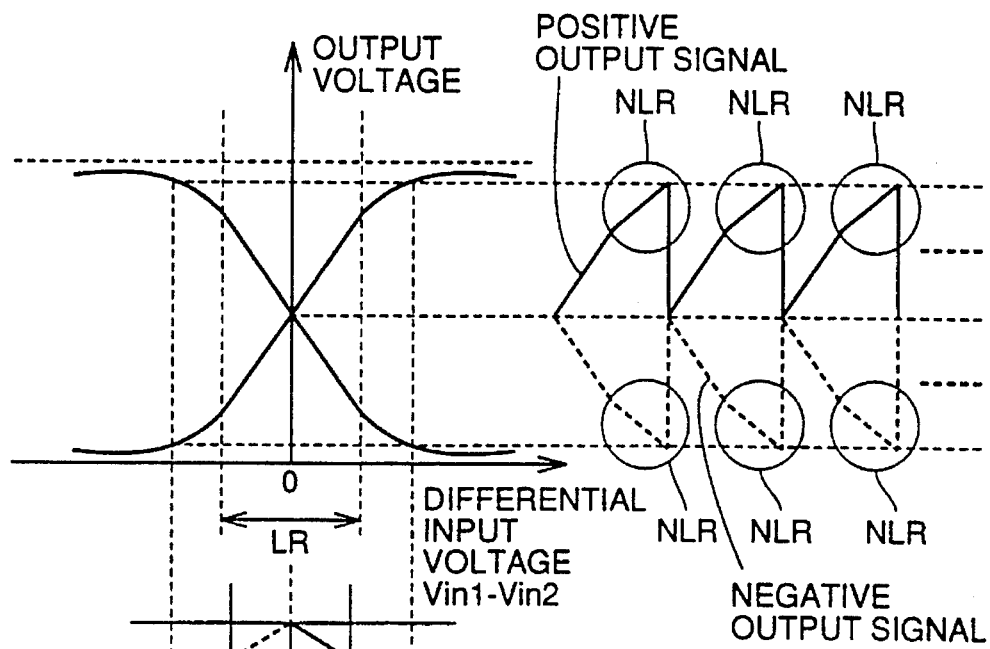
FIG. 25 is a graph showing input/output characteristics of the differential amplifier shown in FIG. 20.
Figure 25B:
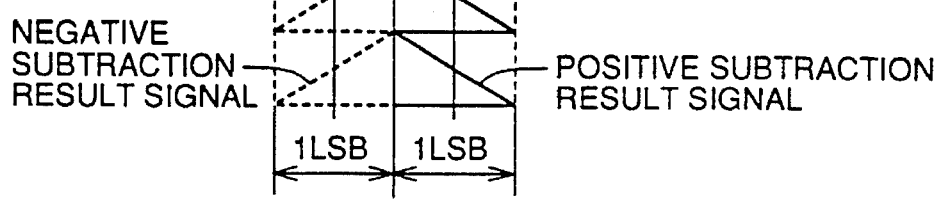

When comparing the upper m bits, assuming every resistance value of positive and negative upper ladder resistance networks 33, 32 is mr, a resistance value of resistances RPa, RNa will be mr, a resistance value of resistances RPb, RPc, RNb, RNc will be r/2 and a resistance value of resistances RPb, RNd will be nr/(4n+1). Input signals are inverted by operational amplifiers OPP, OPN and shifted by ½ LSB of the upper comparing operation for output. Thus, differential analog signals AP, AN are shifted by ½ LSB by input voltage shifting circuit 42 and input to analog subtracting circuit 37. As a result, as shown in FIGS. 19(a) and 19(b), positive and negative subtraction result signals output from analog subtracting circuit 37 are included within the linear range of differential amplifier 38, unlike those shown in FIGS. 15(a) and 15(b). Thus, differential amplifier 38 accurately amplifies the applied positive and negative subtraction result signals for output to lower A-D converter 39. This improves accuracy of the lower comparing operation, and accordingly implements the highly accurate A-D converting operation.

In the above-described eighth through tenth embodiments, although each of the positive and negative subtraction result signals applied to differential amplifier 38 is shifted by ½ LSB by positive and negative upper ladder resistance networks 33, 32, constant current source cell 35b, or input voltage shifting circuit 42, shifting may be conducted by other portions, and other shifting means may be employed because each shifting means shown is only an example. Also, in the above-described eighth through tenth embodiments, although the structure using the differential analog signals has been described, a single analog signal may be used as in the first through seventh embodiments in order to shift the potential of 1LSB of the upper A-D converting operation with using the linear range of the differential amplifier, thus obtaining the similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An A-D converter for converting an analog signal to a digital signal, comprising:
   first reference potential generating means for generating first reference potentials;
   second reference potential generating means for generating second reference potentials substantially identical to said first reference potentials;
   first comparing means for comparing potential of said analog signal with said first reference potentials for outputting first comparison result signals;
   selecting means for selecting a predetermined third reference potential from among said second reference potentials in response to said first comparison result signals;
   subtracting means for subtracting said third reference potential from said analog signal;
   third reference potential generating means for generating fourth reference potentials based on predetermined fifth reference potentials among said second reference potentials;
   second comparing means for comparing potential of an output signal from said subtracting means with said fourth reference potentials for outputting second comparison result signals; and
   converting means for converting said first and second comparison result signals into said digital signal.

2. The A-D converter according to claim 1, further comprising sample and hold means for sampling and holding said analog signal.

3. The A-D converter according to claim 1, wherein
   said first and second reference potential generating means include a plurality of resistors connected in series for dividing a predetermined voltage by resistors for generating said first and second reference potentials.

4. The A-D converter according to claim 3, wherein
   a resistance value of the resistors on both ends of said plurality of resistances is half a resistance value of other resistors.

5. The A-D converter according to claim 1, wherein
   said third reference potential generating means includes
   differential amplifying means for differentially amplifying said fourth reference potentials among said second reference potentials, and
   a plurality of resistances connected in series for dividing a potential output from said differential amplifying means by resistances.

6. The A-D converter according to claim 5, wherein
   a difference of the potentials output from said differential amplifying means includes a voltage of 2LSBs (least significant bit) of a first comparing operation carried out by said first comparing means.

7. The A-D converter according to claim 5, wherein
   a resistance value of the resistors on both ends of said plurality of resistors is half a resistance value of other resistors.

8. The A-D converter according to claim 1, wherein said converting means includes
   a first encoder for encoding said first comparison result signals,
   a second encoder for encoding said second comparison result signals, and
   adding/subtracting means for adding/subtracting output signals respectively from said first and second encoders for conversion into said digital signal.

9. The A-D converter according to claim 1, wherein
   first comparing operation carried out by said first comparing means includes comparing operation of upper 5 bits of said analog signal,
   second comparing operation carried out by said second comparing means includes comparing operation of lower 6 bits of said analog signal, and
   said digital signal output from said converting means includes a 10-bit digital signal.

10. The A-D converter according to claim 1, wherein
    said selecting means further includes first switching means of the same number as said second reference potentials for controlling connection between said second reference potential generating means and said subtracting means.

11. The A-D converter according to claim 1, wherein said selecting means includes
    first switching means of the same number as said second reference potentials for controlling connection between said second reference potential generating means and said subtracting means, and
    second switching means having substantially identical structure as said first switching means for receiving said analog signal and for outputting said analog signal to said subtracting means, said second switching means being normally turned on.

12. The A-D converter according to claim 11, wherein
    said first switching means includes
    first transmission gates turning on or turning off in response to said first comparison result signals, and
    said second switching means includes
    a second transmission gate having one end thereof connected to a power supply and the other end connected to the ground potential, said second transmission gate being normally turned on.

13. The A-D converter according to claim 11, wherein
    said second switching means is disposed near said first switching means.

14. The A-D converter according to claim 1, wherein
    said selecting means includes
    third switching means of the same number as said second reference potentials for controlling connection between said second reference potential generating means and said subtracting means,
    controlling means for outputting a control signal controlling a timing for turning on or turning off said third switching means, and
    fourth switching means having substantially identical structure as said third switching means for receiving said analog signal and for outputting said analog signal to said subtracting means in response to said control signal.

15. The A-D converter according to claim 14, wherein said first comparing means includes first comparators of the same number as said first reference potentials; and said controlling means includes a second comparator having substantially identical structure as said first comparators for controlling turning on or turning off of said fourth switching means, and clock signal generating means for outputting a clock signal for controlling operations of said first and second comparators.

16. The A-D converter according to claim 14, wherein said third switching means includes first inverting means for inverting said first comparison result signals, and third transmission gates turning on or turning off in response to said first comparison result signals and output signals from said first inverting means; and wherein said fourth switching means includes second inverting means for inverting an output signal from said second comparator, and a fourth transmission gate turning on or turning off in response to output signals from said second comparator and said second inverting means.

17. The A-D converter according to claim 16, wherein said fourth switching means is disposed near said third switching means, and said second comparator is disposed near said first comparing means.

18. The A-D converter according to claim 1, wherein said selecting means includes fifth switching means of the same number as said second reference potentials for controlling connection between said second reference potential generating means and said subtracting means, and sixth switching means having substantially identical structure as said fifth switching means for outputting said analog signal to said subtracting means, said sixth switching means being disposed near said fifth switching means.

19. The A-D converter according to claim 18, wherein said fifth and sixth switching means are disposed between said first and second reference potential generating means.

20. An A-D converter for converting an analog signal into a digital signal, comprising:

first reference potential generating means for generating first reference potentials;

first comparing means for comparing potential of said analog signal with said first reference potentials for generating first comparison result signals;

selecting means for selecting a predetermined second reference potential from among said first reference potentials in response to said first comparison result signals;

subtracting means for subtracting said second reference potential from said analog signal;

second reference potential generating means for generating third reference potentials based on predetermined fourth reference potentials among said first reference potentials;

second comparing means for comparing potential of the output signal from said subtracting means with said third reference potentials for outputting second comparison result signals; and converting means for converting said first and second comparison result signals into said digital signal.

21. An A-D converter for converting an analog signal to a digital signal, comprising:

upper comparator means for comparing a potential of said analog signal with a plurality of upper reference potentials;

subtracting means for subtracting a predetermined voltage from said analog signal in response to an upper comparison result by said upper comparison means such that the potential of said analog signal is between a first potential and a second potential, and outputting a lower analog signal;

differential amplifying means for differentially amplifying said lower analog signal;

lower comparison means for comparing a potential of said lower analog signal which are amplified differentially by said differential amplifying means with a plurality of predetermined lower reference potentials; and output means for outputting a digital signal corresponding to said analog signal in response to said upper and lower comparison results by said upper and lower comparison means;

wherein said first and second potentials are included within a linear range of input/output characteristics of said differential amplifying means.

22. The A-D converter according to claim 21, wherein said upper comparison means includes upper reference potential output means for dividing an upper comparison range of said analog signal by a difference between said first and second potentials, and outputting a middle potential of each divided range as said upper reference potential, and comparing means for comparing said plurality of upper reference potentials output from said upper reference potential output means with said analog signal.

23. The A-D converter according to claim 22, wherein said upper reference potential output means includes a ladder resistance network in which a plurality of resistances are connected in series, a resistance value of resistances on both ends of said ladder resistance network being half a resistance value of the other resistances.

24. The A-D converter according to claim 21, wherein said subtracting means includes analog signal output means for outputting a reference analog signal having a predetermined potential in response to said upper comparison result, and analog subtracting means for subtracting said reference analog signal from said analog signal, wherein said analog signal output means shifts the potential of said reference analog signal by ½ of a difference between said first and second potentials for output.

25. The A-D converter according to claim 24, wherein said upper comparison means outputs an upper comparison result signal for each of said plurality of upper reference potentials, and wherein said analog signal output means includes a first constant current source cell provided for each said upper comparison result signal for outputting a first current in response to said upper comparison result signal, a second constant current cell for outputting a second current which is half said first current, and a third current output means for outputting a third current which is obtained by addition of the first and second currents output from said first and second constant current source cells.

26. The A-D converter according to claim 21, wherein said subtracting means includes shifting means for shifting the potential of said analog signal by ½ of a difference between said first and second potentials, and lower analog signal output means for subtracting a predetermined voltage from said analog signal shifted by said shifting means in response to the upper comparison result by said upper comparison means, and outputting said lower analog signal.

27. The A-D converter according to claim 26, wherein said shifting means includes a first resistance having one end thereof connected to a predetermined voltage, an operational amplifier having an input terminal connected to said first resistance and receiving said analog signal, and a second resistance connected to input and output terminals of said operational amplifier, wherein a resistance value of said first and second resistances is set to a value which is shifted from the potential of said analog signal output from said operational amplifier by ½ of a difference between said first and second potentials.

28. The A-D converter according to claim 21, wherein said analog signal includes a first differential analog signal and a second differential analog signal, said A-D converter serving as a differential A-D converter which converts a potential difference between said first and second differential analog signals into a digital signal, wherein said upper comparison means includes first upper comparison means for comparing a potential of said first differential analog signal with a plurality of predetermined first upper reference potentials, and second upper comparison means for comparing a potential of said second differential analog signal with a plurality of predetermined second upper reference potentials, and wherein said subtracting means includes first subtracting means for subtracting a predetermined voltage from said first differential analog signal in response to a first upper comparison result by said first comparison means such that the potential of said first differential analog signal is between said first and second potentials, and outputting a first differential analog signal, and second subtracting means for subtracting a predetermined voltage from said second differential analog signal in response to a second upper comparison result by said upper comparison means such that the potential of said second differential analog signal is between said first and second potentials, and outputting a second lower differential analog signal, and wherein said differential amplifying means includes differentially amplified signal output means for differentially amplifying said first and second lower differential analog signals, and outputting first and second differentially amplified analog signals, and wherein said lower comparison means includes first lower comparison means for comparing a potential of said first differentially amplified analog signal output from said differentially amplified signal output means with a plurality of predetermined first lower reference potentials, and second lower comparison means for comparing a potential of said second differentially amplified analog signal output from said differentially amplified signal output means with a plurality of predetermined second lower reference potentials, and wherein said output means outputs said digital signal corresponding to a potential difference between said first and second differential analog signals in response to said first and second upper comparison results by said first and second upper comparison means and said first and second lower comparison results by said first and second lower comparison means.

29. The A-D converter according to claim 28, wherein said first upper comparison means includes first upper reference potential output means for dividing an upper comparison range of said first differential analog signal by a difference between said first and second potentials, and outputting a potential at a mid point of each divided range as said first upper reference potential, and first comparison means for comparing the plurality of first upper reference potentials output from said first upper reference potential output means with said first differential analog signal, and wherein said second upper comparison means includes second upper reference potential output means for dividing an upper comparison range of said second reference analog signal by a difference between said first and second potentials, and outputting a potential at a mid point of each divided range as said second upper reference potential, and second comparison means for comparing the plurality of second upper reference potentials output from said second upper reference potential output means with said second differential analog signal.

30. The A-D converter according to claim 29, wherein said first upper reference potential output means includes a first ladder resistance network in which a plurality of resistances are connected in series, a resistance value of resistances on both ends of said first ladder resistance network being half a resistance value of the other resistances, and wherein said second upper reference potential output means includes a second ladder resistance network in which a plurality of resistances are connected in series, a resistance value of resistances on both ends of said second ladder resistance network being half a resistance value of the other resistances.

31. The A-D converter according to claim 28, wherein said first subtracting means includes first analog signal output means outputting a first reference analog signal having a predetermined potential in response to said first upper comparison result, and first analog subtracting means for subtracting said first reference analog signal from said first differential analog signal, said first analog signal output means shifting the potential of said first reference analog signal by ½ of the difference between said first and second potentials for output, and wherein said second subtracting means includes second analog signal output means outputting a second reference analog signal having a predetermined potential in response to said second upper comparison result, and second analog subtracting means for subtracting said second reference analog signal from said second differential analog signal, said second analog signal output means shifting the potential of said second analog signal by ½ of the difference between said first and second potentials for output.

32. The A-D converter according to claim 31, wherein said first upper comparison means outputs a first upper comparison result signal for each said first upper reference potential, and wherein said first analog signal output means includes a first constant current source cell provided for each said upper comparison result signal for outputting a first current in response to said first upper comparison result signal, a second constant current source cell outputting a second current which is half said first current, and first current output means outputting a third current which is obtained by addition of said first and second currents, and wherein said second upper comparison means outputs a second upper comparison result signal for each said second upper reference potential, and wherein said second analog signal output means includes a third constant current source cell provided for each said second upper comparison result signal for outputting a fourth current in response to said second upper comparison result signal, a fourth constant current source cell outputting a fifth current which is half said fourth current, and second current output means outputting a sixth current which is obtained by addition of said fourth and fifth currents.

33. The A-D converter according to claim 28, wherein said first subtracting means includes first shifting means for shifting the potential of said first differential analog signal by ½ of the difference between said first and second potentials, and first lower analog signal output means for subtracting a predetermined voltage from said first differential analog signal shifted by said first shifting means in response to the first upper comparison result by said first upper comparison means, and outputting a first lower analog signal, and wherein said second subtract means includes second shifting means for shifting the potential of said second differential analog signal by ½ of the difference between said first and second potentials, and second lower analog signal output means for subtracting a predetermined voltage from said second analog signal shifted by said second shifting means in response to the second upper comparison result by said second lower comparison means, and outputting a second lower analog signal.

34. The A-D converter according to claim 33, wherein said first shifting means includes a first resistance having one end thereof connected to a predetermined voltage, a first operational amplifier having an input terminal connected to said first resistance and receiving said first differential analog signal, and a second resistance connected to input and output terminals of said first operational amplifier, a resistance value of said first and second resistances being set to a value shifted from the potential of said first differential analog signal by ½ of the difference between said first and second potentials, and wherein said second shifting means includes a third resistance having one end thereof connected to a predetermined voltage, a second operational amplifier having an input terminal connected to said third resistance and receiving said second differential analog signal, and a fourth resistance connected to input and output terminals of said second operational amplifier, a resistance value of said third and fourth resistances being set to a value shifted from the potential of said second differential analog signal by ½ of the difference between said first and second potentials.

* * * * *